United States Patent
Reano et al.

(10) Patent No.: US 10,418,238 B2
(45) Date of Patent: Sep. 17, 2019

(54) DEVICES, SYSTEMS, AND METHODS FOR LIGHT EMISSION AND DETECTION USING AMORPHOUS SILICON

(71) Applicant: Ohio State Innovation Foundation, Columbus, OH (US)

(72) Inventors: Ronald M. Reano, Columbus, OH (US); Michael Wood, Albuquerque, NM (US); Ryan Patton, Columbus, OH (US)

(73) Assignee: Ohio State Innovation Foundation, Columbus, OH (US)

(*) Notice: Subject to any disclaimer, the term of this patent is extended or adjusted under 35 U.S.C. 154(b) by 0 days.

(21) Appl. No.: 15/978,606

(22) Filed: May 14, 2018

(65) Prior Publication Data
US 2018/0330946 A1    Nov. 15, 2018

Related U.S. Application Data

(60) Provisional application No. 62/505,390, filed on May 12, 2017.

(51) Int. Cl.
*G02F 1/295* (2006.01)
*H01L 21/02* (2006.01)
(Continued)

(52) U.S. Cl.
CPC .... *H01L 21/02238* (2013.01); *G02B 6/12004* (2013.01); *G02B 6/12009* (2013.01); *G02B 6/1223* (2013.01); *G02B 6/1225* (2013.01); *G02B 6/42* (2013.01); *G02F 1/0136* (2013.01); *G02F 1/025* (2013.01); *G02F 1/313* (2013.01); *H01L 21/02252* (2013.01); *H01L 31/0232* (2013.01); *G02B 2006/12061* (2013.01);
(Continued)

(58) Field of Classification Search
CPC ......... B82Y 20/00; G02B 6/1225; G02F 1/01; G02F 1/011; G02F 1/025; G02F 1/295
See application file for complete search history.

(56) References Cited

U.S. PATENT DOCUMENTS

| | | | | |
|---|---|---|---|---|
| 4,479,846 A | * | 10/1984 | Smith | C30B 13/00 117/43 |
| 2005/0242904 A1 | * | 11/2005 | Lutz | H03H 3/0077 333/200 |
| 2014/0093993 A1 | * | 4/2014 | Payne | H01L 31/18 438/57 |

OTHER PUBLICATIONS

Almeida, et al., "All-optical control of light on a silicon chip," Nature 431, 1081-1084 (2004).
(Continued)

*Primary Examiner* — Jennifer Doan
(74) *Attorney, Agent, or Firm* — Meunier Carlin & Curfman LLC

(57) ABSTRACT

Amorphous silicon devices, systems, and related methods are described herein. An example method for fabricating a thin film with light-emitting or light-detecting capability can include depositing a thin film of amorphous silicon on a wafer such that crystalline defects are distributed throughout the thin film. Additionally, an example photonic device can include a p-doped region and an n-doped region formed on a wafer, and a resonator structure formed on the wafer. The resonator structure can be formed from amorphous silicon and can be arranged between the p-doped and n-doped regions to form a PIN junction. Optionally, the photonic device can be incorporated into a monolithic integrated optical system.

19 Claims, 13 Drawing Sheets

(51) Int. Cl.
H01L 31/0232 (2014.01)
G02B 6/12 (2006.01)
G02F 1/025 (2006.01)
G02B 6/122 (2006.01)
G02B 6/42 (2006.01)
G02F 1/01 (2006.01)
G02F 1/313 (2006.01)

(52) U.S. Cl.
CPC .............. G02B 2006/12123 (2013.01); G02B 2006/12138 (2013.01); G02B 2006/12178 (2013.01)

(56) References Cited

OTHER PUBLICATIONS

Altug, et al., "Photonic crystal nanocavity array laser," Optics Express 13, 8819-8828 (2005).
Baehr-Jones, et al., "Myths and rumours of silicon photonics," Nature Photonics 6, 206-208 (2012).
Barrios, et al., "Electrically driven silicon resonant light emitting device based on slot-waveguide", Opt. Express 13, 10092-10101 (2005).
Bhat, et al., "The 0.9 eV defect luminescence band in sputtered and other forms of plasma-deposited a-Si: H," Philos. Mag. Part B 47, L99-L105 (1983).
Bogaerts, et al., "Nanophotonic waveguides in silicon-on-insulator fabricated with CMOS technology," Journal of Lightwave Technology 23, 401-412 (2005).
Boninelli, et al., "Hydrogen induced optically-active defects in silicon photonic nanocavities", Opt. Express 22, 8843 (2014).
Boyd, et al., "Sensitive disk-resonator photonic biosensor," Applied Optics 40, 5742-5747 (2001).
Boyraz, et al., "Demonstration of a silicon Raman laser," Optics Express 12, 5269-5273 (2004).
Brouckaert, et al., "Planar concave grating demultiplexer fabricated on a nanophotonic silicon-on-insulator platform," Journal of Lightwave Technology 24, 1269-1275 (2007).
Burr, et al., "Zero-coupling-gap degenerate band edge resonators in silicon photonics," Optics Express 23, 30933-30942 (2015).
Burr, et al., "Degenerate band edge resonances in coupled periodic silicon optical waveguides," Optics Express 21, 8736-8745 (2013).
Burr, et al., "Fifth power scaling of quality factor in silicon photonic degenerate band edge resonators," in CLEO: 2014, OSA Technical Digest (online) (Optical Society of America, 2014, paper STu3M.2.
Camacho-Aguilera et al., "An electrically pumped germanium laser," Opt. Express, vol. 20, No. 10, pp. 11316-11320, May 2012.
Chelikowsky, et al., "Nonlocal pseudopotential calculations for the electronic structure of eleven diamond and zinc-blende semiconductors," Physical Review B 14, 556-582 (1976).
Dean, et al., "New radiative recombination processes involving neutral donors and acceptors in silicon and germanium," Physical Review 161, 711-729 (1967).
Densmore, et al., "Silicon photonic wire biosensor array for multiplexed real-time and label-free molecular detection," Optics letters 1, 3598-3600 (2009).
Ellis, et al., "Ultralow-threshold electrically pumped quantum-dot photonic crystal nanocavity laser," Nature Photonics 5, 297-300 (2011).
Engemann, et al., "Photoluminescence in amorphous silicon", Phys. Status Solidi B 79, 195-202 (1977).
Fang, et al., "Electrically pumped hybrid AlGaInAs-silicon evanescent laser," Optics Express 14, 9203-9210 (2006).
Figotin, et al., "Gigantic transmission band-edge resonance in periodic stacks of anisotropic layers," Physical Review E 72, 036619 (2005).
Figotin, et al., "Slow wave phenomena in photonic crystals," Laser & Photonics Reviews 5, 201-213 (2011).

Foresi, et al., "Small radius bends and large angle splitters in SOI waveguides," Proceedings SPIE 3007, 112-118 (1997).
Fukazawa, et al., "Very Compact Arrayed-Waveguide-Grating Demultiplexer Using Si Photonic Wire Waveguides," Japan Journal of Applied Physics 43, L673-L675 (2004).
Ghica, et al., "Annealing of hydrogen-induced defects in RF-plasma-treated Si wafers: ex situ and in situ transmission electron microscopy studies," Journal of Physics D: Applied Physics 44, 295401:1-8 (2011).
Harke, et al., "Low-loss singlemode amorphous silicon waveguides", Electron. Lett. 41, 1377 (2005).
Heck, et al., "Energy Efficient and Energy Proportional Optical Interconnects for Multi-Core Processors: Driving the Need for On-Chip Sources," IEEE Journal of Selected Topics in Quantum Electronics 20(4), 8201012 (2014).
Henry, et al., "Photoluminescence characterization of plasma exposed silicon surfaces", J. Appl. Phys. 70, 5597 (1991).
Huang, et al., "21-GHz-bandwidth germanium-on-silicon photodiode using thin SiGe buffer layers", IEEE Journal Selected Topics in Quantum Electronics 12, 1450-1454 (2006).
Hunt, et al., "Label-free biological and chemical sensors," Nanoscale 2, 1544-1559 (2010).
Intel, "The 50G silicon photonics link." White Paper. (2010), 5 pages.
Iqbal, et al., "Label-free biosensor arrays based on silicon ring resonators and high-speed optical scanning instrumentation," IEEE Journal of Selected Topics in Quantum Electronics 16, 654-661 (2010).
Iwamoto, et al., "Observation of enhanced photoluminescence from silicon photonic crystal nanocavity at room temperature," Applied Physics Letters 91, 211104:1-3 (2007).
Jalali, et al., "Silicon Photonics, "IEEE Microwave Magazine 7, 58-68 (2006).
Jeng, et al., "Hydrogen plasma induced defects in silicon," Applied Physics Letters 53, 1735-1737 (1988).
Johnson, et al., "Hydrogen in crystalline semiconductors: A review of experimental results", Phys. B 170, 3-20 (1991).
Johnson, et al., "Defects in single-crystal silicon induced by hydrogenation," Physical Review B 35, 4166-4169 (1987).
Khan, et al., "Ultrabroad-bandwidth arbitrary radiofrequency waveform generation with a silicon photonic chip-based spectral shaper," Nature Photonics 4, 117-122 (2010).
Kimerling, "Silicon microphotonics," Applied Surface Science 159, 8-13 (2000).
Koch, et al., "The American Institute for Manufacturing Integrated Photonics: advancing the ecosystem," International Society for Optics and Photonics SPIE OPTO, 977202-977202 (2016).
Komljenovic, et al., "Heterogeneous Silicon Photonic Integrated Circuits," Journal of Lightwave Technology 34, 20-35 (2016).
Krzyżanowska, et al., "Electroluminescence from Er-doped SiO2/nc—Si multilayers under lateral carrier injection," Mater. Sci. Eng. B 177, 1547-1550 (2012).
Kuyken, et al., "On-chip parametric amplification with 26.5 dB gain at telecommunication wavelengths using CMOS-compatible hydrogenated amorphous silicon waveguides," Optics Letters 36, 552-554 (2011).
Lee, et al., "Characterization of a 4×4 Gb/s parallel electronic bus to WDM optical link silicon photonic translator," IEEE Photonics Technology Letters 19, 456-459 (2007).
Lin, et al., "Luminescence enhancement by Si ring resonator structures on silicon on insulator", Appl. Phys. Lett. 92, 021113 (2008).
Liu, et al., "A high-speed silicon optical modulator based on a metal-oxide semiconductor capacitor," Nature 427, 615-618 (2004).
Lu, et al., "Quantum confinement and light emission in SiO2/Si superlattices," Nature 378, 258-260 (1995).
Manfrinato, et al., "Resolution limits of electron-beam lithography toward the atomic scale," Nano Letters 13, 1555-1558 (2013).
Miller, "Device requirements for optical interconnects to silicon chips," Proceedings IEEE 97, 1166-1185 (2009).
Miller, "Integrated optics: an introduction," Bell System Technical Journal 48, 2059-2069 (1969).

(56) References Cited

OTHER PUBLICATIONS

Miller, "Optical interconnects to electronic chips," Applied Optics 49, F59-F70 (2010).
Miller, et al., "Achieving optical gain in waveguide-confined nanocluster-sensitized erbium by pulsed excitation", J. Appl. Phys. 108, 063109 (2010).
Mishima, et al., "Investigation of the bubble formation mechanism in a-Si:H films by Fourier-transform infrared microspectroscopy", J. Appl. Phys. 64, 3972 (1988).
Moustakas, "Sputtered hydrogenated amorphous silicon", J. Electron. Mater. 8, 391-435 (1979).
Narayanan, et al., "Optical nonlinearities in hydrogenated-amorphous silicon waveguides," Optics Express 18, 8998-9005 (2010).
Nashashibi, et al., "Injection luminescence in amorphous silicon p+-i-n+ junctions," J. Phys. Colloq., 42, C4-467-C4-470 (1981).
Ng, et al., "An efficient room-temperature silicon-based light-emitting diode," Nature, vol. 410, No. 6825, pp. 192-194, Mar. 2001.
Nordmark, et al., "Transmission electron microscopy study of hydrogen defect formation at extended defects in hydrogen plasma treated multicrystalline silicon," Journal of Applied Physics 105, 033506:1-7, (2009).
Oguma, et al., "Four-channel flat-top and low-loss filter for wide passband WDM access network," Electronics Letters 37, 514-515 (2001).
Pafchek, et al., "Low-loss silicon-on-insulator shallow-ridge TE and TM waveguides formed using thermal oxidation," Applied Optics 48, 958-963 (2009).
Painter, et al., "Two-dimensional photonic band-gap defect mode laser" Science 284, 1819 (1999).
Pankove, et al., "Electroluminescence in amorphous silicon," Appl. Phys. Lett. 29, 620-622 (1976).
Park, et al., "Electrically Driven Single-Cell Photonic Crystal Laser," Science 305, 1444-1447 (2004).
Philipp, et al., "Optical constants of silicon in the region 1 to 10 eV," Physical Review 120, 37-38 (1960).
Purcell, "Spontaneous emission probabilities at radio frequencies," Physical Review 69, 681 (1946).
Rabiei, et al., "Polymer Micro-Ring Filters and Modulators", J. Lightwave Technol. 20, 1968-1975 (2002).
Ramírez et al., "Er-doped light emitting slot waveguides monolithically integrated in a silicon photonic chip," Nanotechnology, vol. 24, No. 11, p. 115202, 2013.
Rao, et al., "Electro-optical effect in hydrogenated amorphous silicon-based waveguide-integrated p-i-p and p-i-n configurations", Opt. Eng. 52, 087110 (2013).
Recht, et al., "On the temperature dependence of point-defect-mediated luminescence in silicon," Appl. Phys. Lett., vol. 94, No. 25, p. 251113, (2009).
Rong, et al., "A continuous-wave Raman silicon laser," Nature 433, 725-728 (2005).
Ruege, et al., "Multimode waveguide-cavity sensor based on fringe visibility detection," Optics Express 17, 4295-4305 (2009).
Ruege, et al., "Multimode waveguides coupled to single mode ring resonators," Journal of Lightwave Technology 27, 2035-2043 (2009).
Savio et al., "Enhanced 1.54 µm emission in Y—Er disilicate thin films on silicon photonic crystal cavities," Opt. Express, vol. 21, No. 8, pp. 10278-10288, Apr. 2013.
Savio, et al., "Room-temperature emission at telecom wavelengths from silicon photonic crystal nanocavities", Appl. Phys. Lett. 98, 201106 (2011).
Selvaraja, et al., "Low-loss amorphous silicon-on-insulator technology for photonic integrated circuitry," Optics Communications 282, 1767-1770 (2009).
Shakoor et al., "Enhancement of room temperature sub-bandgap light emission from silicon photonic crystal nanocavity by Purcell effect," Phys. B Condens. Matter, vol. 407, No. 20, pp. 4027-4031, (2012).
Shakoor et al., "Room temperature all-silicon photonic crystal nanocavity light emitting diode at sub-bandgap wavelengths," Laser Photonics Rev., vol. 7, No. 1, pp. 114-121, (2013).
Shirai, et al., "Role of Atomic Hydrogen During Growth of Hydrogenated Amorphous Silicon in the 'Chemical Annealing'", Jpn. J. Appl. Phys. 30, L679-L682 (1991).
Soref, "Mid-infrared photonics in silicon and germanium," Nature Photonics 4, 495-497 (2010).
Soref, "The Past, Present, and Future of Silicon Photonics," IEEE Journal of Selected Topics in Quantum Electronics 12, 1678-1687 (2006).
Street, "Recombination in a—Si:H: Defect luminescence", Phys. Rev. B 21, 5775 (1980).
Street, et al., "Recombination in a-Si: H: Transitions through defect states", Phys. Rev. B 30, 5861 (1984).
Subbaraman, et al., "Recent advances in silicon-based passive and active optical interconnects", Opt. Express 23, 2487 (2015).
Sun, et al., "Cantilever couplers for intra-chip coupling to silicon photonic integrated circuits," Optics Express 17, 4565-4574 (2009).
Sun, et al., "Large-scale nanophotonic phased array," Nature 493, 195-199 (2013).
Sun, et al., "Submilliwatt thermo-optic switches using freestanding silicon-on-insulator strip waveguides," Optics Express 18, 8406-8411 (2010).
Tien, "Light Waves in Thin Films and Integrated Optics," Applied Optics 10, 2395-2413 (1971).
Vahala, "Optical microcavities," Nature 424, 839-846 (2003).
Vollmer, et al., "Whispering-gallery-mode biosensing: label-free detection down to single molecules," Nature Methods 5, 591-596 (2008).
Wang, et al., "Electroluminescence and forward bias current in p-i-n and p-b-i-n a-Si:H solar cells," J. Appl. Phys., vol. 73, No. 9, pp. 4567-4570, May 1993.
Weman, et al., "Strain-induced quantum confinement of carriers due to extended defects in silicon," Physical Review B 42, 3109-3113 (1990).
Wood, et al., "7 nm/V DC tunability and millivolt scale switching in silicon carrier injection degenerate band edge resonators," Optics Express 24, 23481-23493 (2016).
Wood, et al., "Degenerate band edge resonances in periodic silicon ridge waveguides," Optics Letters 40, 2493-2496 (2015).
Wood, et al., "Optimization of electron beam patterned hydrogen silsesquioxane mask edge roughness for low-loss silicon waveguides," Journal of Nanophotonics 8, 083098:1-14 (2014).
Wood, et al., "Periodic Silicon Ridge Waveguides Exhibiting Degenerate Band Edge Resonances," in Frontiers in Optics, OSA Annual Meeting (Optical Society of America, 2015), paper FTu1B.1. 2 pages.
Xia, et al., "Ultra-compact high order ring resonator filters using submicron silicon photonic wires for on-chip optical interconnects," Optics Express 15, 11934-11941 (2007).
Xu, e al., "Electrically tunable optical polarization rotation on a silicon chip using Berry's phase," Nature Communications 5, 5337 (2014).
Xu, et al., "12.5 Gbit/s carrier-injection-based silicon micro-ring silicon modulators," Optics Express 15, 430-436, (2007).
Xu, et al., "Silicon microring resonators with 1.5-µm radius," Optics Express 16, 4309-4315(2008).
Yablonovitch, et al., "Auger recombination in silicon at low carrier densities," Applied Physics Letters 49, 587,589 (1986).
Yamada, et al., "Si photonic wire waveguide devices," IEEE Journal of Selected Topics in Quantum Electronics 12, 1371-1379 (2006).
Zacharias, et al., "Size-controlled highly luminescent silicon nanocrystals: a SiO/SiO2 superlattice approach," Applied Physics Letters 80, 661-663 (2002).
Zhang, et al., "Low threshold and high speed short cavity distributed feedback hybrid silicon lasers," Optics Express 22, 10202-10209 (2014).

\* cited by examiner

☒ SILICON ☐ SILICON DIOXIDE ▨ HYDROGENATED AMORPHOUS SILICON

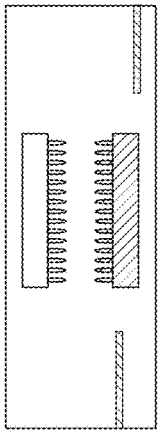
FIG. 11B
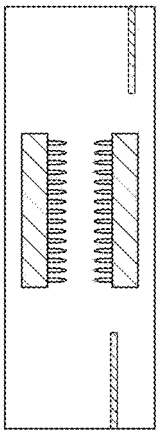
FIG. 11A
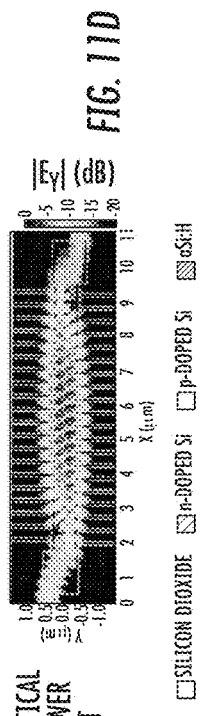
FIG. 11C
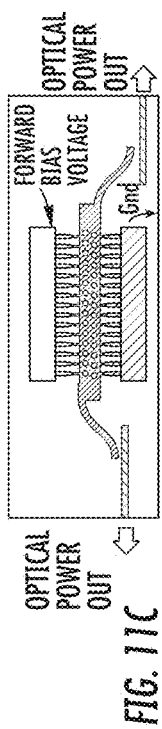
FIG. 11D
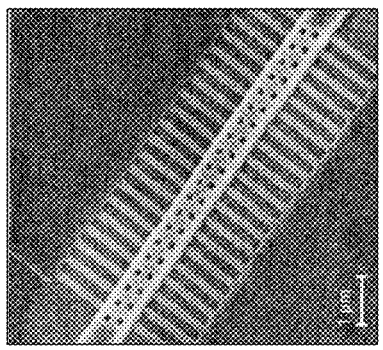
FIG. 12B
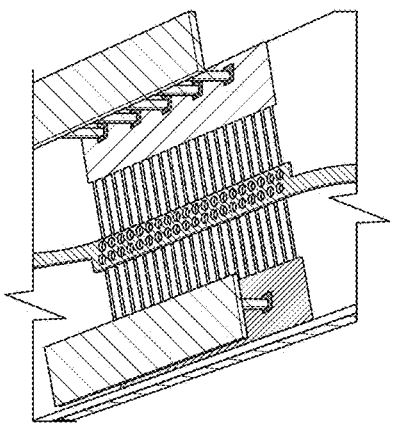
FIG. 12A
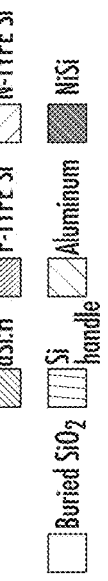

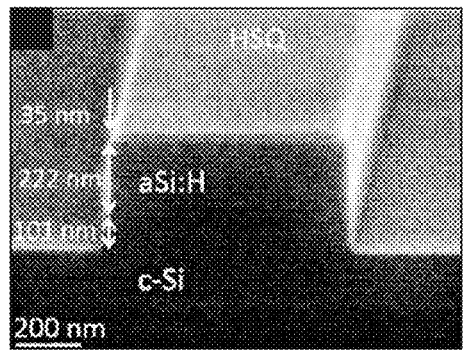
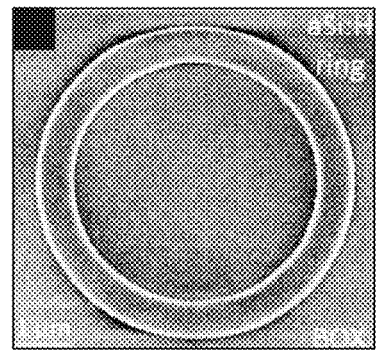
FIG. 16A  FIG. 16B
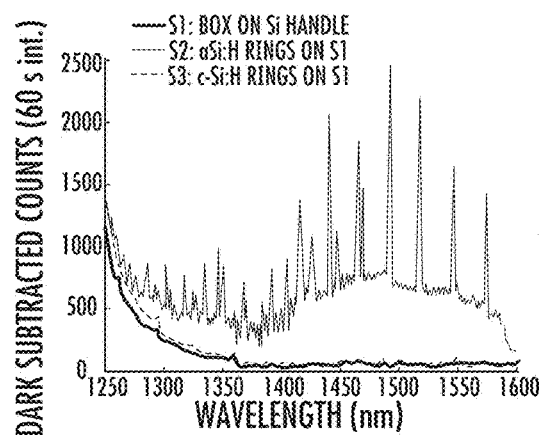
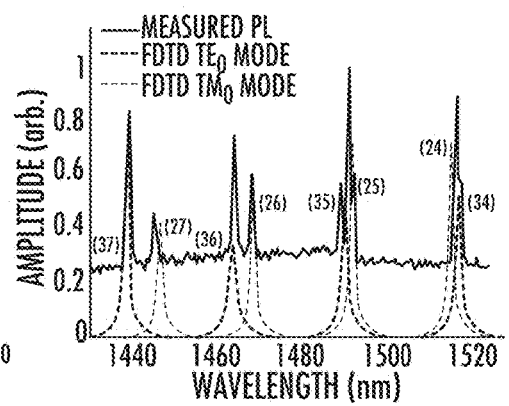
FIG. 17A  FIG. 17B

DEVICES, SYSTEMS, AND METHODS FOR LIGHT EMISSION AND DETECTION USING AMORPHOUS SILICON

CROSS-REFERENCE TO RELATED APPLICATIONS

This application claims the benefit of U.S. provisional patent application No. 62/505,390, filed on May 12, 2017, and entitled "DEVICES, SYSTEMS, AND METHODS FOR LIGHT EMISSION AND DETECTION USING AMORPHOUS SILICON," the disclosure of which is expressly incorporated herein by reference in its entirety.

STATEMENT OF GOVERNMENT SUPPORT

This invention was made with government support under ECCS-0954996 awarded by the National Science Foundation. The government has certain rights in the invention.

BACKGROUND

The integrated photonics concept is the application of thin-film technology to optical circuits and devices for the purpose of achieving efficient, high-performance, and economical optical systems. Photons are guided on a planar chip by integrated photonic waveguides. The field can be viewed as the optical equivalent of microelectronics for integrated circuits. It concerns the physics of light waves in thin films, materials and losses, light coupling, and nonlinear interactions in waveguide structures. In addition to its inherent compactness, stability, and reproducibility, a primary advantage is the optical confinement of the guided-waves which yield high electric fields at low absolute power levels.

Driven by the communication bottleneck in very-large-scale integration (VLSI) electronics, significant momentum in silicon photonics has recently occurred, yielding a potential explosion of applications in sensors, optical interconnects, integrated microsystems, and computing. Integrated optics in silicon is particularly attractive because it is compatible with well-developed and cost-efficient complementary metal-oxide-semiconductor (CMOS) technology and can be integrated with electronic devices monolithically. For operation at 1.55 µm wavelength, single-mode silicon strip waveguides surrounded by a silicon dioxide cladding have submicrometer cross sections of typically 450 nm by 250 nm due to the high contrast between the refractive indices of silicon (3.48) and silicon dioxide (1.44). Highly confined optical modes allow for densely integrated waveguides and small radius of curvature waveguide bends. Key components have been demonstrated in silicon including optically pumped lasers, dense optical waveguide interconnects, compact filters, low power switches, and high-speed electrical-to-optical and optical-to-electrical converters.

Conventional demonstrations of photoluminescence (PL) and electroluminescence (EL) in silicon (Si) have involved a wide variety of dopants in Si including Er/Si-nanoclusters, optically active hydrogen (H) defects caused by ion implantation or plasma treatment, Y—Er disilicate films, dislocation loops due to B doping, C doping, and ion implantation of Si self-interstitials. Of these demonstrations, only H defects from surface plasma treatment have demonstrated room temperature EL in the 1550 nm telecommunications wavelength range while operating near CMOS-compatible voltages. Other demonstrations of EL in Si emit at shorter wavelengths (less than 1200 nm), emit only at cryogenic temperatures, or require bias voltages of 50 V or larger for measurable emission. In other words, these other demonstrations of electrically driven light emission in silicon are not feasible for use in integrated optical systems.

SUMMARY

Amorphous silicon devices, systems, and related methods are described herein. For example, a chip-scale monolithic integrated optical system in silicon including a light source, a lightwave circuit, and a detector are described. The optical system capitalizes on experimental results that demonstrate light emission at telecommunications wavelengths from amorphous silicon resonators. The optical system spans research concepts from optical physics, material science, and electrical engineering at fundamental science and technological application levels.

Hydrogenated amorphous silicon (aSi:H) thin films with enhanced spontaneous light emission are described herein. Optimized process parameters for the deposition of aSi:H thin films by low temperature plasma enhanced chemical vapor deposition (LT-PECVD) are described herein. The aSi:H thin films achieve light emission in the 1.550 µm wavelength range with significant luminescence quantum yield. The LT-PECVD process creates defects in aSi:H which produce sub-bandgap states in the infrared spectrum. Resonators patterned in the thin films enhance luminescence by the Purcell effect, which is the increase in spontaneous emission rate proportional to the ratio of resonator quality factor to mode volume (Q/V). CMOS compatible patterned aSi:H thin films optimized for light emission at telecommunications wavelengths can be realized according to the techniques described herein.

Hydrogenated amorphous silicon (aSi:H) PIN junction devices for on-chip light generation and detection are also described herein. Cavities such as ring resonators and band-edge resonators patterned in aSi:H thin films can be straddled with crystalline silicon p-doped and n-doped regions to form PIN junctions. Forward voltage bias produces electroluminescence from the electrical injection of carriers into the aSi:H thin film resonator, while reverse voltage bias produces photodetection. Band-edge resonators are periodic dielectric waveguide resonators that are useful for their higher order scaling of Q/V with respect to the number of periods. Two-row band-edge resonators are capable of Q/V scaling to the fourth power of the number of periods, two orders of magnitude larger than one-row band-edge resonators. Multi-row bend-edge resonators, such as three-row, four-row, and n-row (n>5) band-edge resonators, scale at even larger powers. Monolithic quasi-monochromatic light sources and resonant photodetectors in aSi:H that operate at wavelengths in the low loss transmission range of crystalline silicon (cSi) waveguides can be realized according to the techniques described herein.

Chip-scale monolithic integrated optical system in silicon including a light source, lightwave circuit, and detector are also described herein. For example, an integrated optical system can include a light source, a lightwave circuit, and a detector in hybrid aSi:H and cSi integrated photonics that are interconnected on a single monolithic chip. Any embodiment of a lightwave circuit can be placed between light source and detector. For example, the lightwave circuit can be a sensing element to realize a complete sensor system on-chip. The lightwave circuit can also include on-chip polarization controllers for dynamic polarization control and/or fiber-to-chip couplers for coupling light on and off chip. Alternatively, the lightwave circuit can be an architecture involving complex switching, filtering, modulation, and multiplexing for optical signal processing and computing. Alternatively, the lightwave circuit can be a simple waveguide transmission medium for interconnect and signal routing applications. Passive band-edge resonators are particularly sensitive resonant devices, indicating that they are suitable as sensitive elements in lightwave circuit architectures. Thermo-optic tuning can be used for small scale tuning of optical wavelength and alignment of resonances in the light source and the photodetector. Multiplexing of banks of emitters and detectors enables spectral use over a large wavelength range. Monolithic integrated optical systems over an optical spectrum that harnesses the massive parallelism of silicon integrated photonics can be realized according to the techniques described herein.

An example method for fabricating a thin film with light-emitting or light-detecting capability can include depositing a thin film of amorphous silicon on a wafer. Crystalline defects can be distributed throughout the thin film.

Optionally, the thin film has a thickness greater than about 50 nanometers (nm). Alternatively or additionally, the crystalline defects can be distributed greater than 50 nm from a surface of the thin film.

Alternatively or additionally, the thin film can be deposited using a low temperature plasma enhanced chemical vapor deposition (LT-PECVD) process.

Alternatively or additionally, the method can further include patterning and etching a resonator structure from the thin film. For example, the resonator structure can include, but is not limited to, a ring resonator or a band-edge resonator. Alternatively or additionally, the resonator structure can be configured to exhibit photoluminescence enhancement at a wavelength greater than about 1,100 nm. Optionally, the resonator structure can be configured to exhibit photoluminescence enhancement across wavelengths from about 1,260 nm to about 1,660 nm.

An example photonic device can include a p-doped region, an n-doped region, and a resonator structure formed on a wafer. The resonator structure can be formed from amorphous silicon and can be arranged between the p-doped and n-doped regions to form a PIN junction.

Alternatively or additionally, the resonator structure can be formed from a thin film of amorphous silicon. Alternatively or additionally, crystalline defects can be distributed throughout the thin film. Optionally, the thin film has a thickness greater than about 50 nanometers (nm). Alternatively or additionally, the crystalline defects can be distributed greater than 50 nm from a surface of the thin film.

Alternatively or additionally, the resonator structure can include, but is not limited to, a ring resonator or a band-edge resonator. Alternatively or additionally, the resonator structure can be configured for Q/V scaling. For example, the resonator structure can optionally be a one-row, two-row, or multi-row band-edge resonator.

Alternatively or additionally, the resonator structure can be configured to emit light when a forward bias is applied across the PIN junction. Optionally, the resonator structure can be configured to emit light in-plane with respect to the wafer. Alternatively or additionally, the resonator structure can be configured to exhibit photoluminescence enhancement at a wavelength greater than about 1,100 nm. Optionally, the resonator structure can be configured to exhibit photoluminescence enhancement across wavelengths from about 1,260 nm to about 1,660 nm.

Alternatively or additionally, the resonator structure can be configured to detect light when a reverse bias is applied across the PIN junction.

An example monolithic integrated optical system can include a wafer, a light source integrated on the wafer, a waveguide integrated on the wafer, and a lightwave circuit integrated on the wafer. The light source and the lightwave circuit can be optically coupled through the waveguide.

Alternatively or additionally, the light source can optionally be a photonic device as described herein (e.g., a photonic device formed from an amorphous hydrogenated silicon thin film).

Alternatively or additionally, the integrated optical system can include a photodetector integrated on the wafer. The photodetector can optionally be a photonic device as described herein (e.g., a photonic device formed from an amorphous hydrogenated silicon thin film).

Alternatively or additionally, the lightwave circuit can be any circuit between the light source and the photodetector, depending on the application, e.g., interconnect, sensing, computing, signal processing, etc. Example lightwave circuits can include, but are not limited to, a modulator, a switch, a sensor, an amplifier, a polarization rotator, a tunable filter, a waveguide transmission medium, a resonator, an interferometer, a coupler, a multiplexer, a wavelength converter, or combinations thereof.

Alternatively or additionally, respective resonance wavelengths of the light source and the photodetector can be aligned.

Alternatively or additionally, the integrated optical system can include a plurality of light sources and a plurality of photodetectors. The waveguide can also be a multiplexer, and the plurality of light sources and the lightwave circuit can be optically coupled through the multiplexer. Alternatively or additionally, the lightwave circuit and the plurality of photodetectors can also be optically coupled through a multiplexer (e.g., a second multiplexer). Example multiplexers include, but are not limited to, an arrayed waveguide grating, a planar Echelle grating, or a cascaded Mach-Zehnder interferometer.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

The inset shows an angled view of the cross-section of a silicon strip waveguide.

FIG. 7A illustrates the real part of refractive index, n. FIG. 7B illustrates the imaginary part of refractive index, k.

FIG. 8A illustrates patterning of a silicon ridge waveguide in silicon-on-insulator wafer, FIG. 8B illustrates doping of n-region, FIG. 8C illustrates doping of p region, and FIG. 8D illustrates deposition of aSi:H ring resonator.

FIGS. 11A-11D illustrate a fabrication process for two-row band-edge resonator in aSi:H coupled to cSi bus waveguides. FIG. 11A illustrates patterning of bus waveguides and doping region, FIG. 11B illustrates type n-doping and p-doping of slab regions, FIG. 11C illustrates deposition and patterning of aSi:H, FIG. 11D illustrates 3D FDTD calculation of resonant mode electric field.

FIG. 12A illustrates 3D schematic of two-row band-edge resonator PIN junction device. FIG. 12B illustrates SEM of a fabricated structure in crystalline silicon.

FIGS. 16A-16B illustrate etched aSi:H devices. FIG. 16A is a cross-sectional SEM aSi:H ridge on c-Si used to determine device dimensions and sidewall roughness. FIG. 16B is a SEM of aSi:H ring resonator on thermal $SiO_2$ for use in PL measurements.

FIGS. 17A-17B illustrate photoluminescence measurement results and analysis. FIG. 17A illustrates long-wavelength PL spectrum. FIG. 17B illustrates FDTD analysis of aSi:H ring resonator peaks.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for devices, systems, and methods for spontaneous light emission or light detection using amorphous silicon thin films, it will become evident to those skilled in the art that the implementations are not limited thereto.

Figure 1A:
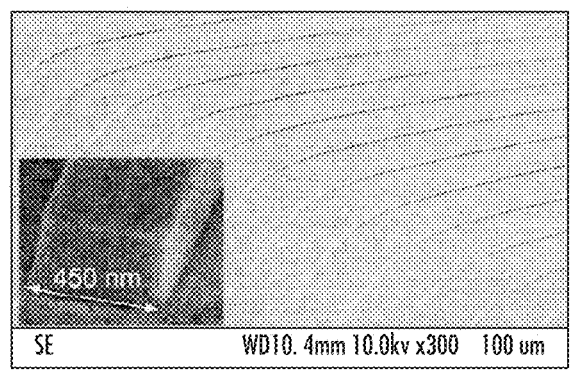
FIG. 1A is a scanning electron micrograph (SEM) of planar optical waveguides.
Figure 1B:
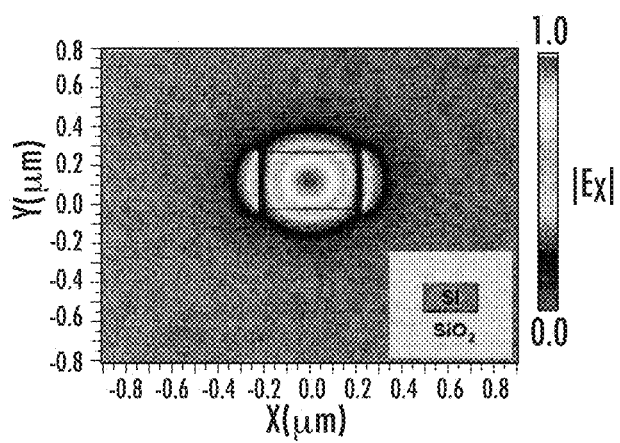
FIG. 1B illustrates calculated optical mode, which shows the high confinement of the electric-field magnitude at 1.55 µm wavelength. The inset shows the material distribution over the waveguide cross-section.

FIG. 1A is a scanning electron micrograph (SEM) of planar optical waveguides, with sub-micrometer scale cross-sectional dimensions, in a thin layer of silicon. FIG. 1B shows the numerically calculated optical mode at 1.55 µm wavelength. The inset shows a silicon waveguide core surrounded by a silicon dioxide ($SiO_2$) cladding. The magnitude of the electric-field of the waveguide mode is highly confined to submicrometer dimensions. Due to the high refractive index contrast, the bend radius of the silicon waveguides can be less than 5 µm without significant bend loss. Furthermore, the transparency range of silicon spans from 1.2 µm to 7.0 µm wavelength, and the transparency range of silicon dioxide spans 0.2 µm to 3.5 µm wavelength. This range covers the telecommunications C-band (1.530 µm to 1.565 µm wavelength) so that low cost telecommunications components can be used with the silicon optical waveguides.

Figure 2:
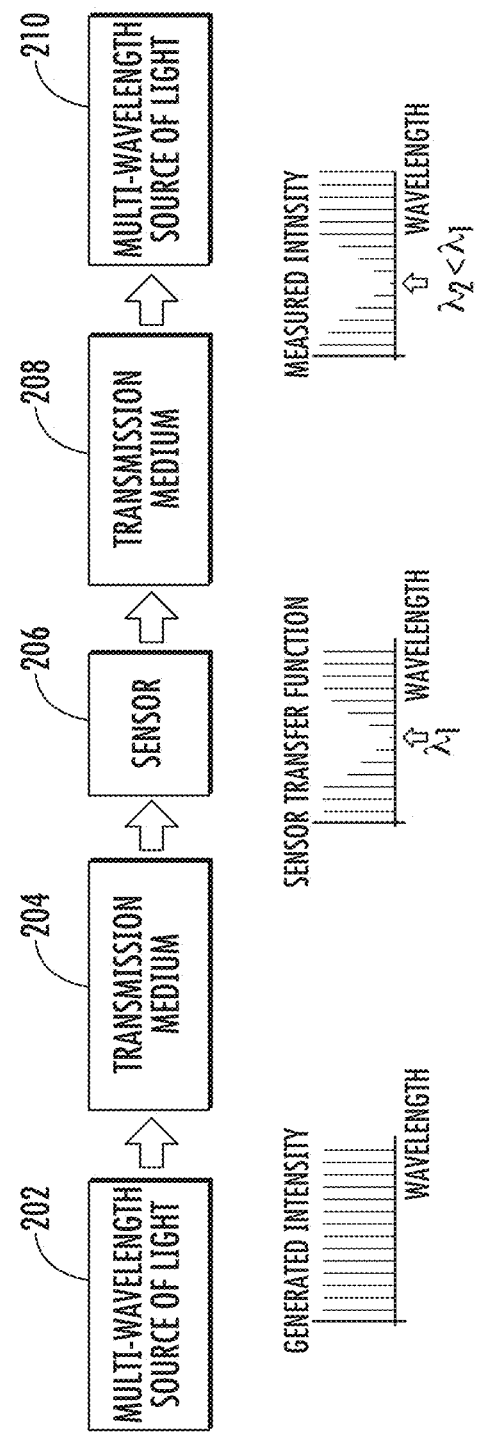
FIG. 2 is a block diagram illustrating building blocks for integrated optical systems in the context of on-chip optical sensing systems.

The basic building blocks for an integrated optical system are shown in FIG. 2 in the context of on-chip optical sensing. As shown in FIG. 2, the integrated optical system can include a light source 202, a waveguide 204, and a lightwave circuit 206 (e.g., a sensor). These components can be integrated on a wafer such as an oxidized silicon wafer or silicon-on-insulator (SOI) wafer, for example. The light source 202 and the lightwave circuit 206 can be optically coupled through the waveguide 204. Optionally, the integrated optical system can further include a photodetector 210 integrated on the wafer. The lightwave circuit 206 and the photodetector 210 can be optically coupled through the waveguide 208. This disclosure contemplates that the light source 202 and/or the photodetector 210 can be a photonic device as described herein, e.g., a resonator structure formed from an amorphous hydrogenated silicon thin film.

The lightwave circuit 206 can be any circuit between the light source 202 and the photodetector 210, depending on the application, e.g., interconnect, sensing, computing, signal processing, etc. Example lightwave circuits can include, but are not limited to, a modulator, a switch, a sensor, an amplifier, a polarization rotator, a tunable filter, a waveguide transmission medium, a resonator, an interferometer, a coupler, a multiplexer, a wavelength converter, or combinations thereof. In some implementations, the lightwave circuit 206 can be a sensing element, for example as shown in FIG. 2. In other implementations, the sensing element can be replaced by any lightwave circuit (e.g., a modulator, a switch, a sensor, an amplifier, a polarization rotator, a tunable filter, a waveguide transmission medium, a resonator, an interferometer, a coupler, a multiplexer, a wavelength converter, or combinations thereof) to generalize the configuration to general integrated optical systems for applications in optical signal processing, computing, and interconnects. As shown in FIG. 2, the integrated optical system can include a multi-wavelength source of light photons, a transmission medium to guide the photons to the sensor region, a sensor with a transfer function that is modified by a sample-under-test, a second transmission medium to guide the modulated transfer function, and finally a multi-wavelength detector of light photons that converts the light energy into electrical energy for processing in the electrical domain. The modification of the sensor transfer function can manifest as a wavelength shift, an intensity change, or an overall change in waveform by placing the sample-under-test in close proximity to the optical mode. Applications include sensing of gases, liquids, and solids for biosensing, chemical sensing, and environmental monitoring.

Figure 3:
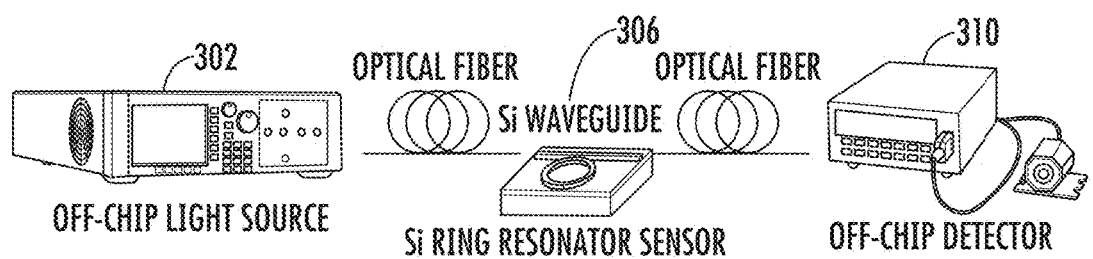
FIG. 3 is a diagram illustrating state-of-the-art silicon integrated optical sensing systems that produce a "chip-in-a-lab" instead of a "lab-on-a-chip".

Limitations of State-of-the-art Chip-scale Integrated Optical Systems in Silicon Photonics Although several key photonic components have been demonstrated in silicon, a monolithic integrated optical system including a light source, lightwave circuit, and detector has yet to be realized in silicon. State-of-the-art strategies involve expensive heterogeneous integration of III-V materials for light sources and integration of group IV materials, such as germanium (Ge), for detectors. For example, in some cases, the light source and/or detector are bonded to the SOI substrates, e.g., the chip-scale optical circuit arranged on the SOI substrate. This type of wafer bonding suffers from low manufacturing yields and is difficult to scale to high-volume production, which makes it an infeasible solution. Additionally, electrically pumped sources using Ge films are multimode and cannot achieve continuous wave operation. Further, these hybrid solutions are not CMOS compatible. Alternatively, the light source and/or the detector are often implemented off-chip via laboratory scale instruments and optical fiber is used to send light to and from a lightwave circuit. In the context of integrated optical sensing systems, instead of a "lab-on-a-chip", the state-of-the-art is more accurately described as a "chip-in-a-lab", as shown in FIG. 3. In FIG. 3, an off-chip light source 302 is optically coupled (e.g., through optical fiber) to a lightwave circuit 306, which is optically coupled to an off-chip photodetector 310 (e.g., through optical fiber). As shown in FIG. 3, the lightwave circuit 306 is the only component integrated on the chip (e.g., wafer), while both the light source 302 and the photodetector 310 are bench equipment. The chip-in-a-lab of FIG. 3 is in contrast to the monolithic integrated optical system described below. A monolithic single chip solution with a light source, lightwave circuit, and photodetector in silicon enables economical, high performance, and miniature sensors systems that are portable to the point-of-need.

Figure 4A:
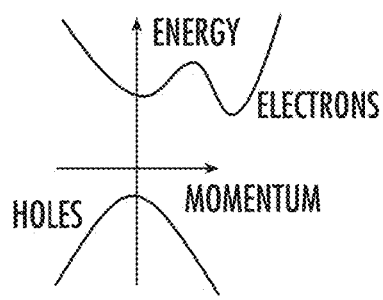
FIG. 4A shows how the indirect bandgap of silicon results in low probability of photon emission.

Realizing a light source in silicon is challenging because of the indirect bandgap (e.g., as shown in FIG. 4A). In silicon, a phonon is required to establish momentum conservation for electron-hole pair radiative recombination. Instead of radiative processes, non-radiative processes dominate through Auger recombination and carrier recombination at surface states.

Figure 4B:
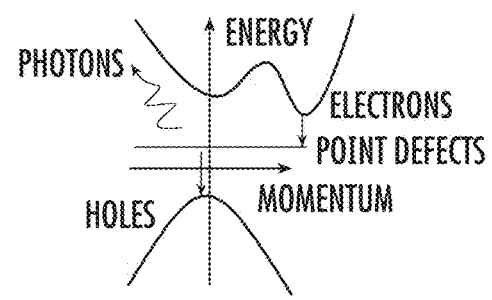
FIG. 4B shows how emission is enhanced from sub-bandgap states due to point defects.

The challenge, then, is to find ways to increase the radiative recombination rate in silicon. Several approaches are currently being pursued based on quantum confinement from point defects. The idea is to confine electrons and holes to regions of space that overlap their wavefunctions. By the Heisenberg uncertainty principle, the particle momentum is broad because the position is localized. Thus, momentum can be conserved, resulting in enhanced probability of radiative recombination. Illustrated in FIG. 4B, point defects form states in the bandgap, converting electron-hole pair recombination into a three level system. Carriers recombine radiatively without the assistance of phonons. FIG. 4A shows the indirect bandgap of silicon results in low probability of photon emission. FIG. 4B shows how emission is enhanced from sub-bandgap states due to point defects.

Hydrogen Defects in Silicon for Room Temperature Electroluminescence

Using hydrogen defects introduced into silicon by hydrogen plasma treatment, room temperature and electrically pumped quasi-monochromatic silicon light emitting diodes (LEDs) have recently been demonstrated in the 1.55 µm wavelength range, which is within the telecommunications band. The defects result in broadband sub-bandgap photoluminescence (PL) that spans the transparency range of silicon. Defects are formed in a photonic crystal nanocavity, with large quality factor to mode volume ratio, to produce enhanced photon emission on resonance due to the Purcell effect. As described below, however, defects introduced by hydrogen plasma treatment are distributed only near the surface, which creates the nanocavity. P-doped and n-doped regions straddle the nanocavity to form a PIN diode, allowing for electrical injection of carriers upon forward voltage bias. Power efficiencies of the silicon light emitting diodes (LEDs) are within an order of magnitude of direct bandgap III-V lasers.

Figure 9A:
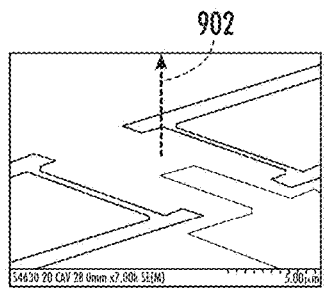
FIGS. 9A-9C illustrate resonator classes in silicon photonics: Photonic crystal nanocavities (FIG. 9A), Ring resonators (FIG. 9B), Band-edge resonators (FIG. 9C).
Figure 9B:
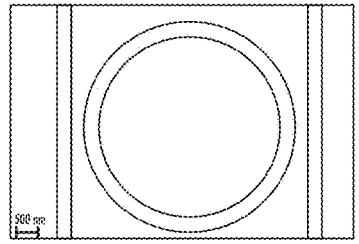
Figure 9C:
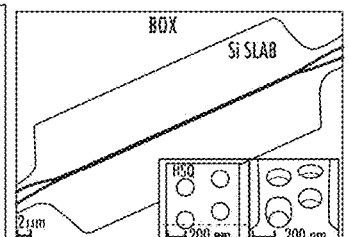

While the state-of-the-art of electrically driven light emission in silicon is promising, significant challenges are apparent. First, the absolute power levels of the silicon LEDs are only in the picowatt range. The reason for the low power levels is the surface nature of the hydrogen defects. Transmission electron microscopy (TEM) imaging shows that the defect population is characterized by nanometer scale vacancies, platelets, and dislocation loops, all within a few tens of nanometers from the surface. Consequently, injected electrical carriers and defects have a very small overlap probability. In contrast, the amorphous silicon devices, systems, and related methods described below enable bulk defects throughout the silicon volume (e.g., crystalline defects are distributed throughout the thin film, i.e., as opposed to surface defects), which significantly enhance the electroluminescence. Second, the photonic crystal nanocavity emits light vertically in a direction that is normal to the surface of the photonic chip (e.g., as shown in FIG. 9A). In contrast, the amorphous silicon devices, systems, and related methods described below include cavities that produce light emission directly into waveguides integrated on the chip (e.g., as shown in FIGS. 9B, 9C), which facilitates realization of a monolithic integrated optical systems. Third, the photonic crystal nanocavity has a fixed quality factor to mode volume ratio (Q/V). In contrast, the amorphous silicon devices, systems, and related methods described below use cavities with large and designer Q/V ratios needed to fully exploit enhanced photon emission by the Purcell effect. Furthermore, instead of forward voltage biasing the PIN junction to produce electroluminescence, the amorphous silicon devices, systems, and related methods described below include reverse voltage bias on the PIN junction to implement photodetection. Accordingly, a platform for the monolithic integration of a light source, a lightwave circuit, and a detector for complete on-chip integrated optical systems in silicon can be realized. The amorphous silicon devices, systems, and related methods described below focus on silicon monolithic on-chip integration, which rules out the hybrid approach involving III-V materials with silicon because of its cost and incompatibility with large scale mass manufacturing.

Room Temperature Photoluminescence from Hydrogenated Amorphous Silicon

An example method for fabricating a thin film with light-emitting or light-detecting capability is described herein. For example, aSi:H can be deposited as a thin film, onto an oxidized silicon wafer, by low temperature plasma enhanced chemical vapor deposition (LT-PECVD). In some implementations, deposition temperatures can be in a range between about 200-400° C. At lower deposition temperatures, the defect density is increased, while higher deposition temperatures begin to form microcrystalline Si, which has high propagation loss due to crystal boundaries. The deposition process creates defects for luminescence quantum yield from thin films deposited at low temperature. When deposited at high temperature (e.g., greater than 400° C.), aSi:H has low defect density, which is more appropriate for signal transmission. The defects in aSi:H create sub-bandgap absorption states in the infrared spectrum. A resonator can then be patterned in the aSi:H thin film in order to enhance the spontaneous emission rate of photons.

Luminescence from aSi:H originates from two mechanisms: band tail recombination with a peak at approximately 1.2 eV (1033 nm), and transitions from the band tails to defect states with peaks near 0.9 eV (1377 nm) and 0.8 eV (1550 nm). The defect luminescence dominates at room temperature because thermal quenching suppresses band edge recombination. Compared to surface plasma treatment with Hz, which generates surface defects in the outer 10-50 nm of the patterned Si waveguide layer, luminescence from aSi:H is a bulk effect that occurs throughout the film. Emission from the bulk improves overlap of the defects with both injected carriers for EL and with the cavity optical mode. As described herein, the focus is on emission at the lower energy band (1300-1600 nm) since it both dominates the PL spectrum when measured at room temperature and emits light in the telecommunications bands.

Figure 5:
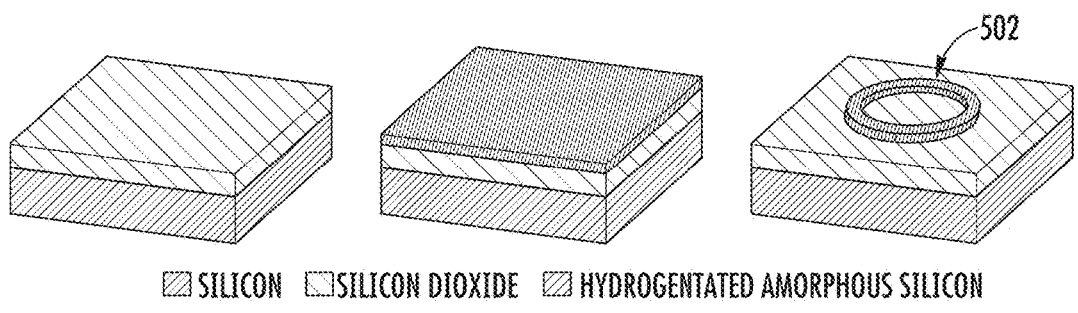
FIG. 5 illustrates the process flow for fabricating hydrogenated amorphous silicon ring resonators.

The example process is shown in FIG. 5. A wafer such as the oxidized silicon wafer in FIG. 5 (left-most figure) can be provided. Additionally, a thin film of amorphous silicon (e.g., hydrogenated amorphous silicon) can be deposited on the wafer as shown in FIG. 5 (center figure). The aSi:H thin film can be deposited by LT-PECVD. As described herein, the crystalline defects are distributed throughout the aSi:H thin film when deposited using the LT-PECVD process, which is in contrast to defects introduced into silicon by hydrogen plasma treatment. Defects introduced into silicon by hydrogen plasma treatment are found only near the surface (e.g., 10-50 nm). On the other hand, crystalline defects introduced into silicon by LT-PECVD are distributed through the thin film, which can have a thickness greater than about 50 nm. It should be understood that 50 nm is provided only as an example and that this disclosure contemplates thin film thickness can be more or less than 50 nm. Optionally, the crystalline defects can be distributed greater than 50 nm from a surface of the aSi:H thin film. It should be understood that 50 nm is provided only as an example and that this disclosure contemplates crystalline defects being distributed more or less than 50 nm from the surface of the aSi:H thin film. Optionally, the crystalline defects can be distributed greater than 60, 70, 80, . . . 200, etc. nm. The point is that the crystalline defects are distributed throughout the thin film as opposed to only near the surface thereof. Thereafter, a resonator structure 502 can be patterned and etched from the thin film. Optical resonators or cavities localize light at specific resonant wavelengths depending on the resonator geometry. Light builds up to a high intensity which increases light-matter interaction and amplifies the effect of external signals such as injected current. For example, the resonator structure 502 can include, but is not limited to, a ring resonator (e.g., such as the uncoupled ring cavity shown in FIG. 5) or a band-edge resonator. It should be understood that ring and band-edge resonators are only provided as example resonator structures and that this disclosure contemplates creating other resonator structures, such as defect mode resonators and photonic crystal cavities, from the aSi:H thin film. Alternatively or additionally, the resonator structure 502 can be configured to exhibit photoluminescence enhancement at a wavelength greater than about the bandgap of cSi (e.g., about 1,100 nm). Optionally, the resonator structure 502 can be configured to exhibit photoluminescence enhancement across wavelengths from about 1,260 nm to about 1,660 nm.

As described above, hydrogen plasma treatment results in only surface defects in the silicon. On the other hand, LT-PECVD introduces defects throughout the thin film. Additionally, LT-PECVD of amorphous silicon can be contrasted with high temperature PECVD of amorphous silicon. High temperature PECVD of amorphous silicon is in the temperature range greater than 400° C. and is useful for fabricating low propagation loss waveguides. LT-PECVD is conducted at lower temperatures (e.g., less than 400° C.) in order to optimize luminescence quantum efficiency. Regarding LT-PECVD parameters, as long as silicon is present in some form at the input (e.g., % $SiH_4$ in He to create aSi:H thin films), then there are a host of parameters to explore in LT-PECVD deposition of aSi. The parameters include, but are not limited to, gas type, gas flow, deposition temperature, chamber pressure, bias power, and RF power.

Figure 6A:
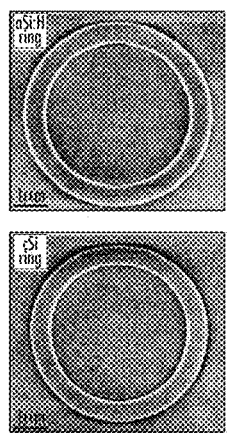
FIG. 6A illustrates SEMs of ring resonators in aSi:H (top) and cSi (bottom).

Scanning electron micrographs (SEMs) of aSi:H ring resonators fabricated on silicon dioxide by LT-PECVD according to the techniques described herein are shown in FIG. 6A. The aSi:H thin film was 220 nm thick and the silicon dioxide thickness was one micrometer. The ring resonator formed of aSi:H thin film (top resonator in FIG. 6A) was optically pumped at 642 nanometers wavelength and then observed the photoluminescence (PL) with a monochromater between 1300 nm and 1600 nm wavelength at room temperature. For comparison, similar ring resonators composed of crystalline silicon (cSi) (bottom resonator in FIG. 6A) instead of aSi:H were also evaluated. The ring resonators of FIG. 6A have 2.5 µm radii. It should be understood that the dimensions (e.g., thin film thickness, wafer thickness, ring radii, etc.) are provided only as examples and that this disclosure contemplates resonator structures having different dimensions.

Figure 6B:
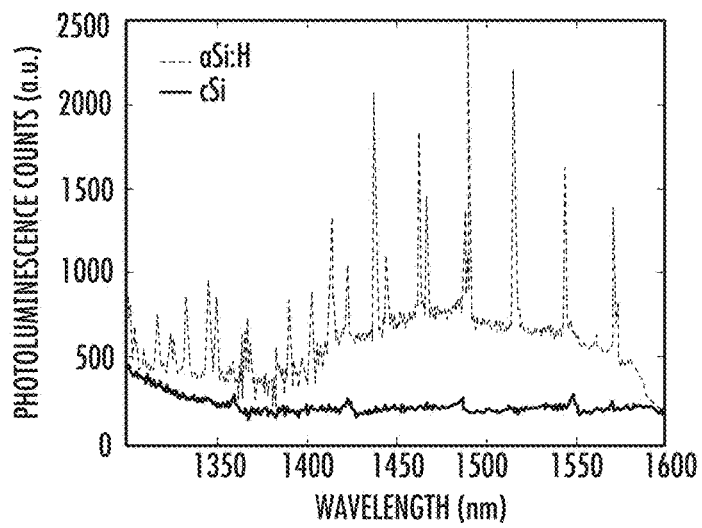
FIG. 6B illustrates room temperature photoluminescence measurements.

Several features are evident in the PL measurements shown in FIG. 6B. First, the aSi:H ring resonator exhibits larger broadband PL across the wavelength range, accompanied by a series of resonance peaks, which are due to the enhancement of spontaneous emission due to the Purcell effect in the ring resonators, as compared to the cSi ring resonator. The resonance peaks for the aSi:H ring resonator exhibit Q values in the 1000 to 3000 range. Overlapping transverse electric (TE) and transverse magnetic (TM) modes are present over multiple free-spectral ranges (FSRs), demonstrating that the LT-PECVD aSi:H patterned thin film produces enhanced PL in the infrared spectrum at room temperature. In the case of the cSi ring resonator, the PL is relatively flat with respect to wavelength and relatively small with respect to intensity. Small periodic discontinuities in the data are artifacts of the measurement setup for the broadband data collection.

Figure 7A:
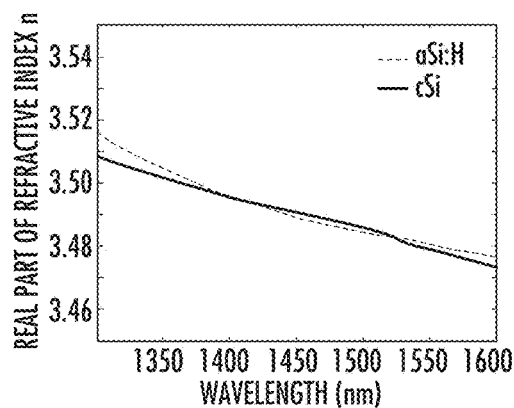
FIGS. 7A-7B illustrate spectroscopic ellipsometry measurements of aSi:H and cSi thin films.
Figure 7B:
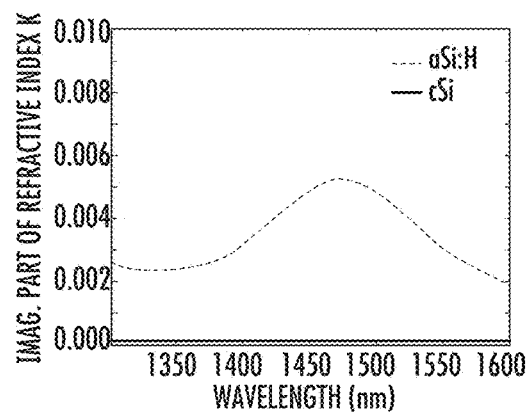

The PL results were cross checked with spectroscopic ellipsometry measurements of the thin films. The real part of the index of refraction, n, is shown in FIG. 7A, and the imaginary part, k, is shown in FIG. 7B. Data for aSi:H and cSi are shown together for comparison. The real part of the refractive index is similar for both aSi:H and cSi. In contrast, the imaginary part of the refractive index for aSi:H is in the range of 0.001 to 0.005, with a spectrum in good agreement with the non-resonant PL data. For crystalline silicon, the imaginary part of the refractive index is below the noise floor of the ellipsometer. The imaginary part of the refractive index indicates the absorptive properties of the material, which in turn indicates the presence of defects in the material. Furthermore, 3D finite difference time domain (FDTD) computations of the uncoupled ring resonators were conducted using the measured values of k from spectroscopic ellipsometry. The quality factors in the modeling were found in agreement with the measured quality factors of the resonances in the PL data.

Further optimization of the thin film deposition of aSi:H produces larger luminescence quantum yield and thus enhanced spontaneous emission at telecommunications wavelengths. There are a host of parameters to optimize in the LT-PECVD deposition of aSi:H. The parameters include gas type, gas flow, deposition temperature, chamber pressure, and RF power. Patterned resonators produce Purcell enhancement of the spontaneous emission. There will be a tradeoff between the amount of spontaneous emission due to the defects in aSi:H and the amount of enhancement due to Purcell effect since the incorporation of defects in the thin film simultaneously increases the spontaneous emission and the imaginary part of the refractive index. Larger imaginary part of the refractive index reduces resonator quality factor which in turn decreases the Purcell enhancement since the enhancement is proportional to the quality factor Q.

Electroluminescence from aSi:H Resonators

As described herein, aSi:H resonators, which are fabricated using LT-PECVD, exhibit electroluminescence. Ring resonators are the simplest resonators to employ due to their inherent simplicity and ease of fabrication. It should be understood that ring resonators are provided only as examples and that other resonator structures can be used. For example, advanced resonator structures can be used as described below. Electrical injection is introduced by straddling the resonator with p-doped and n-doped regions and creating a PIN junction. In order to avoid crystallizing the aSi:H resonator during dopant activation, patterning and activation of the dopants occurs before depositing and patterning the aSi:H resonator. The process flow is shown in top-view and cross-section in FIG. 8 in the case of a ring resonator cavity. The optical power generated in the bus waveguide occurs when a forward bias voltage is applied to the PIN junction. Measurable quantities that describe the electroluminescence device include the generated optical power, spectrum, efficiency, and footprint.

Figures 8A, 8B, 8C, 8D:
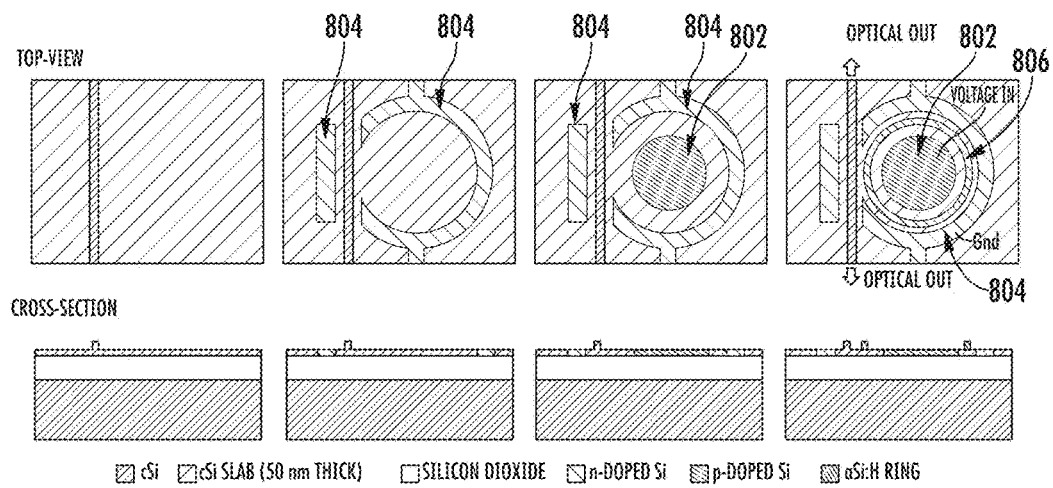
FIGS. 8A-8D illustrate top-view and cross-section view of process flow for electroluminescence from aSi:H ring resonator.

Referring now to FIGS. 8A-8D, an example photonic device can include a p-doped region 802, an n-doped region 804, and a resonator structure 806 formed on a wafer. As shown in FIG. 8D, the resonator structure 806 can be arranged between the p-doped and n-doped regions 802, 804 to form a PIN junction.

As described herein, the resonator structure 806 can be formed from aSi:H thin film. Alternatively or additionally, the resonator structure 806 can include, but is not limited to, a ring resonator or a band-edge resonator. Alternatively or additionally, the resonator structure 806 is configured for Q/V scaling. For example, the resonator structure 806 can optionally be a two-row band-edge resonator as described below.

Alternatively or additionally, the resonator structure 806 can be configured to emit light when a forward bias is applied across the PIN junction. Optionally, the resonator structure can be configured to emit light in-plane with respect to the wafer (e.g., as shown in FIGS. 9B, 9C). Alternatively or additionally, the resonator structure can be configured to detect light when a reverse bias is applied across the PIN junction.

A variety of resonators can be utilized in order to optimize the electroluminescence from aSi:H. Three general classes of resonators, shown in FIG. 9, are under investigation in silicon photonics today: Photonic crystal nanocavities (FIG. 9A), Ring resonators (FIG. 9B), Band-edge resonators (FIG. 9C). In FIG. 9A, the photonic crystal nanocavity LED is shown. In FIG. 9A, the light is emitted vertically in a direction that is normal to the surface of the photonic chip. This is shown by the dotted arrow 902 in FIG. 9A. The class of photonic crystal nanocavities could find applications in sensor applications where vertical light emission is desirable. For on-chip integrated optical systems, however, light coupling directly into waveguide modes is desirable. Therefore, ring resonators shown in FIG. 9B and band-edge resonators shown in FIG. 9C become classes of resonators of interest. As described below, band-edge resonators may be a better choice for optimum electroluminescence from aSi:H.

To determine the class of resonator that is optimum, resonators with the largest quality factor to mode volume ratio (Q/V) have been investigated. The approach is based on the enhancement of spontaneous emission rate from the Purcell effect, quantified through a Purcell enhancement factor $F_p$ as:

$$F_p = \frac{3}{4\pi^2} \frac{Q_{eff}}{V} \left(\frac{\lambda_c}{n}\right)^3, \quad (1)$$

$$\frac{1}{Q_{eff}} = \frac{1}{Q_c} + \frac{1}{Q_e}$$

where $Q_{eff}$ is the effective quality factor, $Q_c$ is the cavity quality factor, $Q_e$ is the linewidth of the emitter quality factor, V is the cavity mode volume, $\lambda_c$ is the cavity resonance wavelength, and n is index of refraction.

From the point-of-view of large Q/V, band-edge resonators are an attractive option. Band-edge resonators are periodic dielectric media which are often implemented in integrated photonics by introducing a periodic array of holes in a strip or rib waveguide, as illustrated in FIG. 9C (inset). The cavity resonance spans the entire length of the periodic region. Therefore, the resonator volume V scales to the first power of the number of periods N in the periodic region. The quality factor scales, however, to the third power or higher. For example, in the case of a Bragg grating with one row of holes in a silicon strip waveguide, the quality factor scales to the third power so that the Q/V ratio scales as $N^2$. Higher order scaling, such as quality factor scaling to the fifth power, occurs in gratings with two rows of holes, resulting in a Q/V ratio that scales as $N^4$. Quality factor scaling to the fifth power has been demonstrated experimentally.

Figure 10:
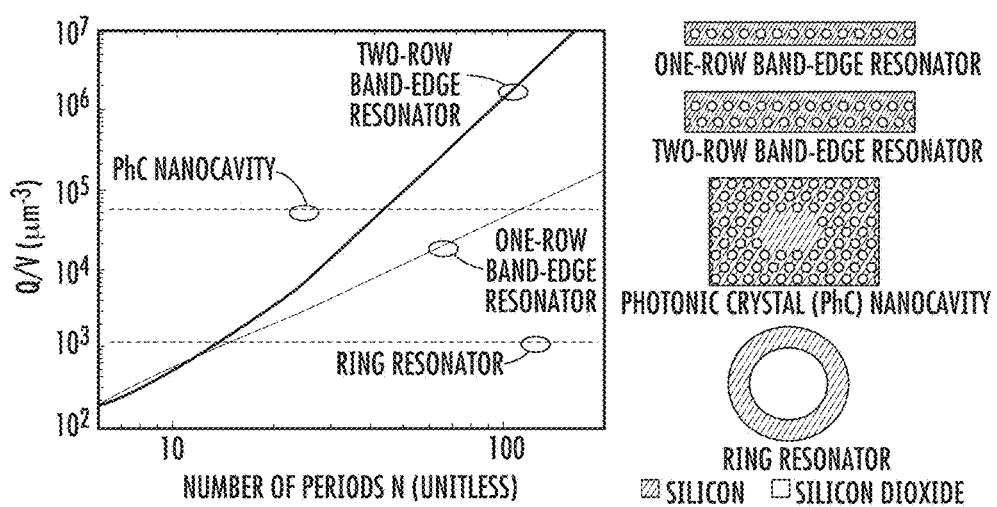
FIG. 10 illustrates three dimensional (3D) finite difference time domain (FDTD) computations of Q/V for one and two-row band-edge resonators. For comparison, an example PhC nanocavity Q/V and the ring resonator Q/V are also shown. Band-edge resonators have the advantage that the Q/V scales with number of periods N.

3D FDTD computations for one-row and two-row band-edge resonators have been conducted to compare the Q/V to the state-of-the-art photonic crystal (PhC) nanocavity LED with surface hydrogen defects and the ring resonator composed of aSi:H thin film. The results are shown in FIG. 10. It can be observed that the Q/V for the PhC nanocavity is on the order of 50,000 while the Q/V for the ring resonator composed of aSi:H thin film is on the order of 1000. The advantage of the band-edge resonators is the scaling of Q/V with number of periods N. For N greater than 43, the two-row band-edge resonator can exceed the PhC nanocavity. Therefore, this disclosure contemplates using band-edge resonators to optimize the electroluminescence in aSi:H.

Optimizing the one and two-row band-edge resonators for efficient electroluminescence involves modeling based on the 3D plane wave expansion method and the 3D FDTD method. Computed results can be compared to experimental measurements from fabricated devices, where non-ideal effects from sidewall surface roughness and non-uniformity in cylindrical holes can be examined in a laboratory setting. Surface roughness can be optimized to less than 0.2 nm by oxidation smoothing. Resolution limits can be pushed to the atomic scale using electron beam lithography with hydrogen silsesquioxane resist.

The process to fabricate an electroluminescence device from a two-row band-edge resonator in aSi:H is shown in FIG. 11. Starting with a silicon-on-insulator (SOI) wafer, bus waveguides are fabricated in the cSi device layer and a thin cSi slab section is patterned to host dopants for the PIN junction. This is shown in FIG. 11A. An array of tapered fingers extend from the main doping area in order to eventually connect electrically to the aSi:H band-edge resonator. Next, the slab sections are p-doped and n-doped. This is shown in FIG. 11B. Then, the aSi:H thin film is deposited and patterned. Directional couplers are formed in the aSi:H in order to optically couple light to the cSi bus waveguides. Finally, two rows of holes are patterned in the aSi:H to form the band-edge resonator. This is shown in FIG. 11C. A forward bias voltage applied to the PIN junction injects carriers into the aSi:H resonator in order to produce electroluminescence. Optical power leaves the resonator and is coupled to the crystalline silicon bus waveguides for low loss guided wave transmission. FIG. 11D illustrates 3D FDTD calculation of resonant mode electric field. It should be understood that a two-row band-edge resonator is described with reference to FIGS. 11A-11D as an example. This disclosure contemplates using multi-row bend-edge resonators, such as three-row, four-row, and n-row (n>5) band-edge resonators. Multi-row band-edge resonators can scale at even larger powers.

On-chip Photodetector from aSi:H Resonators with PIN Junctions

As described above, resonant on-chip PIN photodetectors can be created from the aSi:H thin film. Ring resonators can be used due to their simplicity and ease of fabrication. Band-edge resonators can be utilized due to their expected enhanced performance. A 3D graphic of the band-edge resonator device is shown in FIG. 12A. The on-chip detector uses the same configuration as the on-chip light source. The primary difference is the voltage bias. In other words, reverse voltage bias can be used for photodetection and forward voltage bias can be used for photogeneration.

In the PL spectrum for the aSi:H ring resonators described herein, it is observed that the resonant peaks are pedestaled on a broadband PL spectrum from about 1400 nm to 1600 nm, indicating absorption in that range. Resonant photodetectors can be created to take advantage of the long effective optical path length on resonance. As discussed below, at the optical system level, both light source and photodetector can be resonant devices with resonances tuned to the same wavelength. Optimization of geometry and aSi:H thin film deposition parameters achieves large quantum efficiency and large responsivity. A scanning electron micrograph of a crystalline-silicon band-edge PIN junction resonator is shown in FIG. 12B.

Light Source, Lightwave Circuit, and Photodetector in Hybrid aSi:H and Crystalline Silicon Integrated Photonics A light source, lightwave circuit, and photodetector can be integrated on a silicon wafer to realize an on-chip monolithic silicon integrated optical system. As described above, the large tunability of the two-row band-edge resonator indicates that the passive structure is capable of functioning as a very sensitive and novel lightwave circuit element for switching, electro-optical modulation, and sensing.

Figure 13:
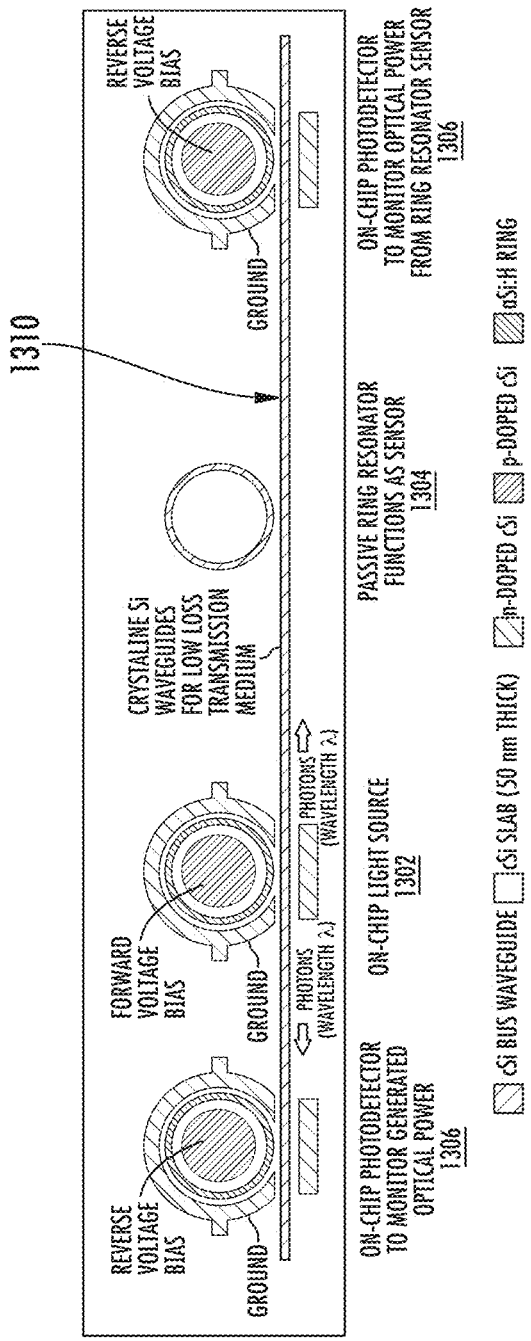
FIG. 13 illustrates an on-chip optical system including source, lightwave circucit, and detector in hybrid aSi:H and cSi utilizing ring resonators.

As an example, for sensing applications, the passive resonator would be very sensitive to changes in local refractive index as a sample of interest comes into proximity to the resonant optical mode. A schematic of an on-chip monolithic integrated optical circuit including a light source 1302, a lightwave circuit 1304 (e.g., sensor), and a photodetector 1306 is shown in FIG. 13. The light source 1302, the lightwave circuit 1304 (e.g., sensor), and the photodetector 1306 are integrated on a wafer. Additionally, the light source 1302, the lightwave circuit 1304 (e.g., sensor), and the photodetector 1306 are optically coupled using a waveguide 1310 (e.g., cSi waveguide) also integrated on the wafer. In FIG. 13, the light source 1302 and the photodetector 1306 are implemented using ring resonators. It should be understood that the light source 1302 and/or the photodetector 1306 can be implemented using other resonator structures including, but not limited to, band-edge resonators. Additionally, a plurality of photodetectors 1306 can be provided as shown in FIG. 13 and described below.

The light source can be a forward biased aSi:H light emitter which emits quasi-monochromatic guided-wave photons into the cSi bus waveguide. Fifty percent of the power is guided to an on-chip photodiode which can be aSi:H photodetector in reverse voltage bias. The other fifty percent of the generated photons can be guided to a passive ring resonator which functions as a refractive index sensor. A sample-under-test is placed in close proximity to the sensor, modulating the transfer function of the passive ring. A second on-chip photodetector converts the light energy into a photocurrent for electrical detection. Thermo-optic tuning of the light source and the photodetector can be used simultaneously to change the emission wavelength and the resonance wavelength of the photodetector in order to sweep the wavelength and simultaneously achieve high signal-to-noise ratio. By sweeping the wavelength, the spectrum of the sensor can be measured.

Figure 14:
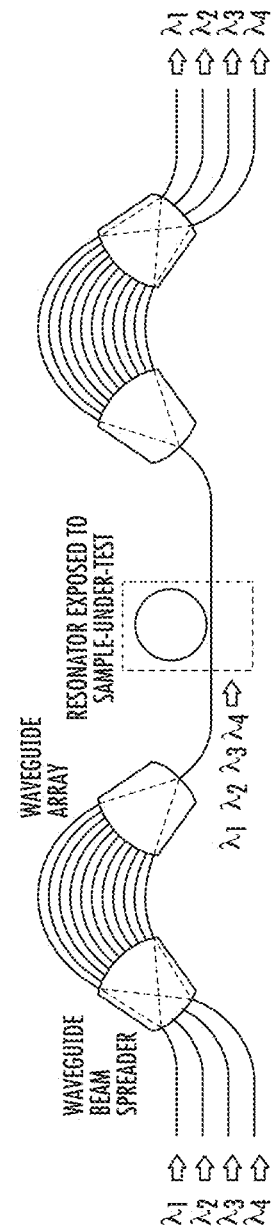
FIG. 14 illustrates a monolithic integrated sensing system based on optical spectrum analyses.

Thermo-optic tuning is useful for fine tuning of the optical wavelength. For broadband spectrum analysis, a bank of on-chip light sources, each of a different wavelength, feeds a multiplexer in order to combine the wavelengths into a single bus waveguide. The power in each wavelength propagates through the sensor, exposed to a sample-under-test, and then into a second multiplexer which outputs to a bank of photodetectors. Multiplexer configurations including arrayed waveguide gratings, planar Echelle gratings, and cascaded Mach-Zehnder interferometers (MZIs). FIG. 14 illustrates back-to-back multiplexers implemented with arrayed waveguide gratings. The system can be validated by exposing the sensor to liquids with varying indices of refraction. For example, the sensor can be exposed to various concentrations of glucose in aqueous solution. The refractive index varies with glucose concentration, resulting in resonance wavelength shifts of the resonator sensor with varying concentration.

Figure 15:
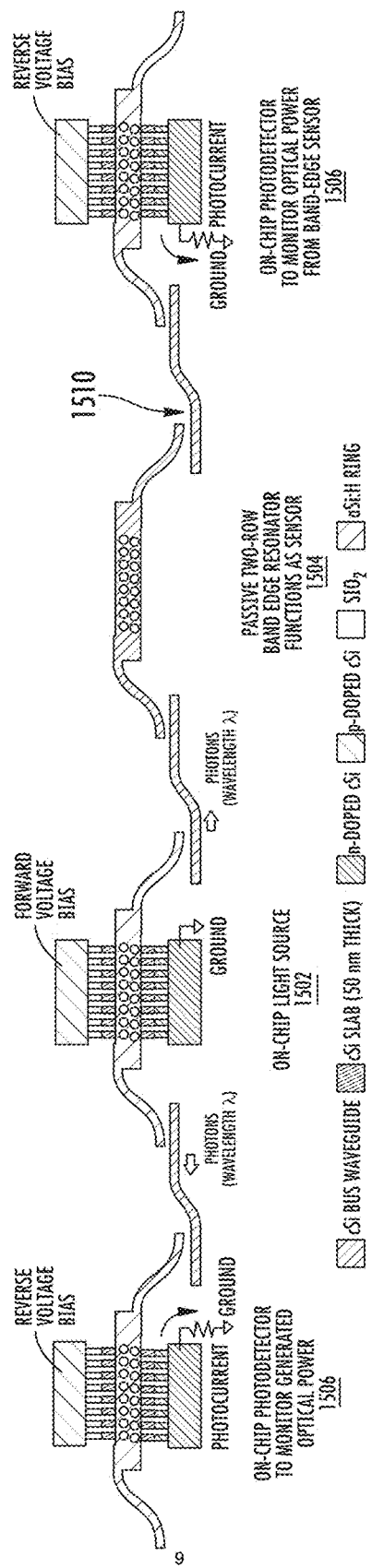
FIG. 15 illustrates an on-chip optical system including source, lightwave circuit, and detector in aSi:H utilizing band-edge resonators.

A similar configuration can be implemented with band-edge resonators. For example, an on-chip monolithic integrated optical circuit including a light source 1502, a lightwave circuit 1504 (e.g., sensor), and a photodetector 1506 is shown in FIG. 15. The light source 1502, the lightwave circuit 1504 (e.g., sensor), and the photodetector 1506 are integrated on a wafer. In FIG. 15, the light source 1502 and the photodetector 1506 are implemented as two-row band-edge resonators. Additionally, similar to FIG. 13, a plurality of photodetectors 1506 can be provided as shown in FIG. 15. Directional couplers are used to couple the aSi:H band-edge resonators to cSi bus waveguides 1510.

Since the introduction of thin film integrated optics in 1969, the objective has been to achieve a "miniature form of laser beam circuitry". Now, nearly 50 years later, silicon photonics is poised to realize this vision. The realization of silicon light sources, lighwave circuits, and detectors on a single chip will significantly enhance the suite of photonic building blocks, thereby providing a route to an avalanche of applications in the context of large scale monolithic integration that can leverage existing CMOS microelectronics infrastructure.

The optical devices and related methods described herein can be used to create a monolithic integrated optical system including a light source, a lightwave circuit, and a detector in hybrid aSi:H and cSi. These concepts provide a new method of attack to achieve complete chip-scale functionalities in silicon photonic integrated circuits. Empowering silicon with the full suite of optical functionalities enables the realization of silicon chips that use photons to overcome the bandwidth limitations imposed by electrons. The continued convergence of silicon and photonics solves a "crisis in computation" that impacts the optical networking, computing, and sensing industries with applications in information technology, telecommunications, health care, the life sciences, and national defense. By appropriate choice of lightwave circuit between source and detector, our invention spans sensing, signal processing, switching, modulation, radio-frequency photonics, and quantum optics.

EXAMPLES

As described herein, aSi:H is an attractive material for integrated optics since it retains many of the material properties of cSi including large refractive index contrast with $SiO_2$ and the potential for low loss waveguides at wavelengths near 1.55 µm with a thermal budget compatible with back-end of line CMOS processes. At lower deposition temperatures (e.g., less than about 400° C.), the defect density increases. At higher deposition temperatures, microcrystalline silicon begins to form which has high propagation loss due to crystal boundaries. The defects in aSi:H include dangling bonds which create sub-bandgap absorption states in the infrared spectrum. The existence of these defect states has allowed for demonstrations of both PL and EL from bulk aSi:H thin films.

As described herein, room temperature PL at wavelengths in the 1300-1600 nm band has been demonstrated from integrated optical ring resonators composed of low deposition temperature plasma enhanced chemical vapor deposition (LT-PECVD) aSi:H. The photoluminescence signal is enhanced at wavelengths corresponding to the resonant modes of the cavity. Example images of fabricated aSi:H devices are shown in FIGS. 16A-16B. Similar PL enhancement has been demonstrated in cSi for wavelengths near the 1.1 µm bandgap of c-Si, which is outside of the fiber optic communication band and also within silicon's absorption band. In other words, light emitters based on cSi would not be useful for on-chip signal routing. Unlike the cSi devices, the aSi:H devices described herein exhibit enhanced PL across the 1300 nm-1600 nm wavelength range. Surface plasma treatment with hydrogen generates nanometer-scale voids but only in the outer 10-50 nm (i.e., surface defects) of the patterned silicon waveguide layer. In contrast, luminescence from aSi:H is a bulk effect that occurs throughout the film; emission from the bulk improves overlap of the defects with both injected carriers for EL and with the cavity optical mode.

Fabrication of the ring resonators begins by depositing aSi:H on an oxidized silicon substrate. In order to make a direct comparison to cSi ring resonators, aSi:H films were deposited on pieces of a SOI wafer with 1 µm of buried oxide (BOX) and a 250 nm cSi device layer on which the device layer had been fully etched away with $Cl_2/O_2$ plasma. Samples from the same SOI wafer with and without the device layer removed were used as oxidized silicon substrate and cSi comparison samples, respectively. Hydrogenated amorphous silicon films are deposited via PECVD with a $SiH_4$:He (5% $SiH_4$ in He) gas flow of 100 sccm, 900 mTorr pressure, 22 W RF power, and 60° C. substrate temperature. The deposited films are 222 nm thick, as shown in FIG. 16A. Ring resonators are patterned with the electron-beam exposed hydrogen silsesquioxane (HSQ) resist and etched with $Cl_2/O_2$ plasma.

Devices are characterized with room temperature PL measurements using a micro-PL system. The pump laser has a fixed wavelength of 642 nm, fiber-coupled output power of 20 mW, and a 35 µm spot size when focused on the sample surface. Light emitted from the sample is collected by an objective lens and filtered to remove wavelengths shorter than 1 µm, particularly the pump signal. The filtered light is coupled into a monochromator (Horiba iHR550) with a liquid nitrogen cooled InGaAs detector array (Horiba Symphony II) to measure the PL spectrum. Measured PL data is shown in FIG. 17A. All three samples exhibit a strong peak near 1.1 µm which corresponds to luminescence at the bandgap of the c-Si that makes up the SOI handle of all three samples. This peak is observed with similar intensity in all three samples since the patterned samples have most of the top device layer removed and a significant portion of the pump light reaches the c-Si substrate.

A notable feature of the spectrum is the increased PL at long wavelengths in aSi:H compared to cSi. The patterned aSi:H sample shows a broadband increase of PL from 1.3-1.6 µm. Luminescence across this spectral band matches well with previous reports of room temperature EL and PL in aSi:H. The PL spectrum from the aSi:H rings features periodic enhancement of the PL at the resonance modes of the cavity due to enhanced radiative recombination from the Purcell effect. Enhancement of up to about 5 dB occurs at the resonant modes.

To confirm the origin of the peaks in PL spectrum of FIG. 17A, three dimensional finite different time domain (FDTD) computations are performed with the same ring resonator geometry (222 nm waveguide height, 550 nm waveguide width, 3.2 µm radius) as the measured device and the aSi:H refractive index (n=3.479 and k=0.003 at 1550 nm) taken from spectroscopic ellipsometry measurements. Simulated ring resonances under transverse electric (TE) and transverse magnetic (TM) excitation are shown in FIG. 17B with PL measurement data overlaid. Good agreement is observed between the computed and measured peaks, indicating that the PL enhancement is due to the formation of resonant modes inside the ring cavity. For each resonance, the mode order m is calculated by m=$2\pi n_{eff} R/\lambda$, where $n_{eff}$ is the simulated mode effective index, $\lambda$ is the resonance wavelength, and R is 3.2 µm ring radius. Mode orders are labeled for each computed resonance in FIG. 17B.

Figure 18A:
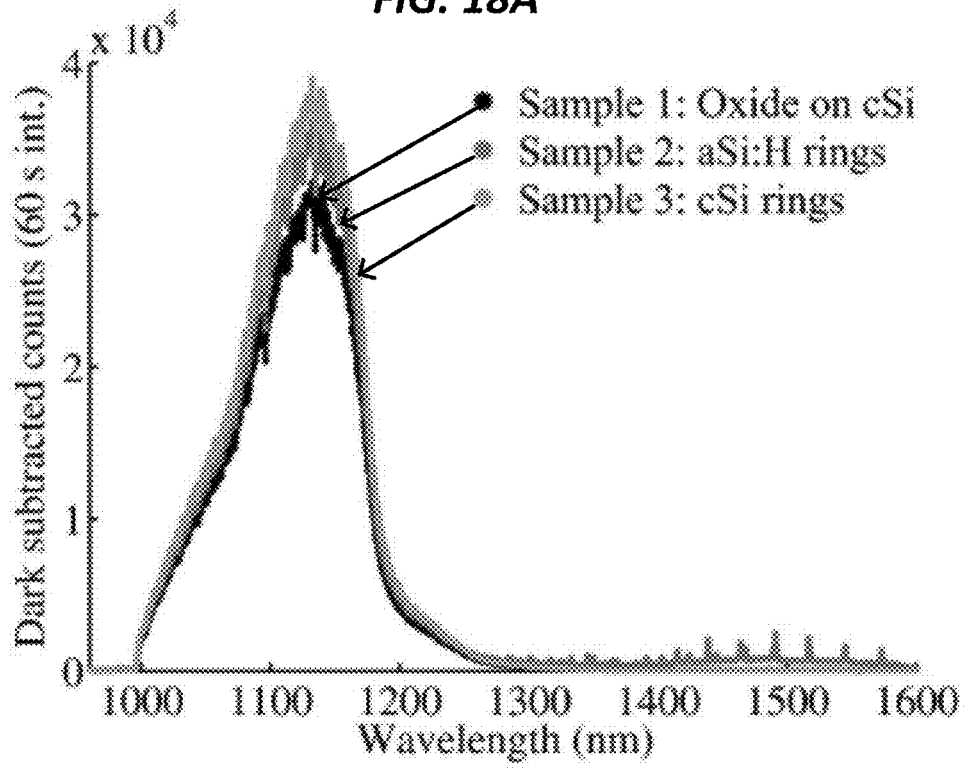
FIG. 18A illustrates measured PL from three samples (Sample 1, Sample 2, Sample 3) taken from a SOI wafer. The peak around 1.1 µm corresponds to the bandgap of cSi that makes up the wafer handle.
Figure 18B:
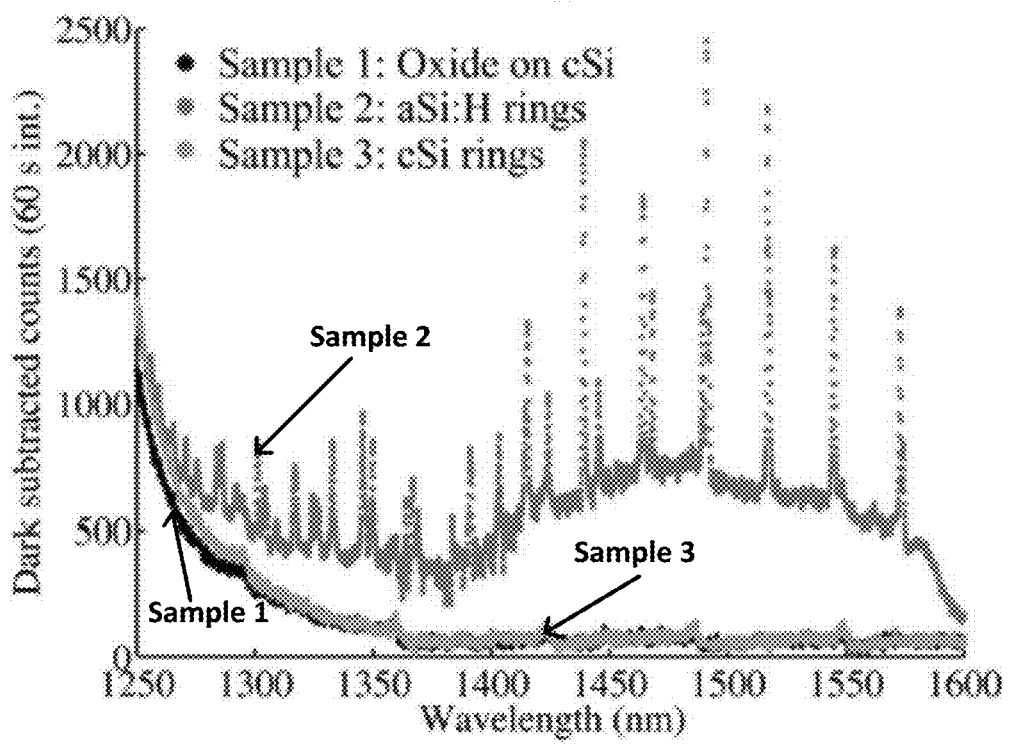
FIG. 18B illustrates zoomed-in view of the telecommunications bands. The aSi:H sample (Sample 2) shows broadband PL as well as enhanced PL at the resonances of the ring.

Measurements were taken from three sample, i.e., an SOI wafer, an aSi:H ring resonator (e.g., such as the aSi:H device shown in FIGS. 16A-16B) on SOI wafer, and a cSi ring resonator on SOI wafer. In FIGS. 18A-18B, the SOI wafer is Sample 1, the aSi:H ring resonator on SOI wafer is Sample 2, and the cSi ring resonator on SOI wafer is Sample 3. There are two notable regions of PL spectra given in FIGS. 18A-18B. The first is the strong peak near 1.1 µm present in all samples (shown in FIG. 18A), and the second is the broadband PL from 1300-1600 nm seen only for Sample 2 (shown in FIG. 18B). The peak at 1.1 µm is luminescence at the bandgap of the cSi that makes up the SOI handle wafer. This peak is observed with similar intensity in all three samples as shown in FIG. 18A since the patterned samples have most of the top device layer removed and a significant portion of the pump light reaches the cSi substrate. The more interesting feature of the spectrum is the increased PL at long wavelengths in aSi:H compared to cSi as shown in FIG. 18B. The patterned aSi:H sample shows a broad increase in PL in the range of 1300-1600 nm (0.95-0.77 eV). Luminescence across this spectral band matches well with previous reports of room temperature EL and PL in aSi:H. In addition, the PL spectrum from the aSi:H ring features enhancement of the PL at the resonance modes of the cavity due to the Purcell effect. This is the first demonstration of PL enhancement in amorphous Si optical resonators in the useful telecommunications wavelengths bands at 1.3 µm and 1.5 µm.

The PL peaks are fit with Lorentzian line shapes that decay to the noise floor (about 200 counts) yielding Q values of 600-1400. Measured Q values for the aSi:H rings are significantly smaller than the 120,000 measured for crystalline Si ring resonators in. The reduction in Q for the aSi:H rings is due to significant material loss. The material loss is extracted from refractive index measurements using a spectroscopic ellipsometry system (J. A. Woollam W-2000). Ellipsometry results for the aSi:H film are shown in FIG. 19 along with cSi data.

Figure 19:
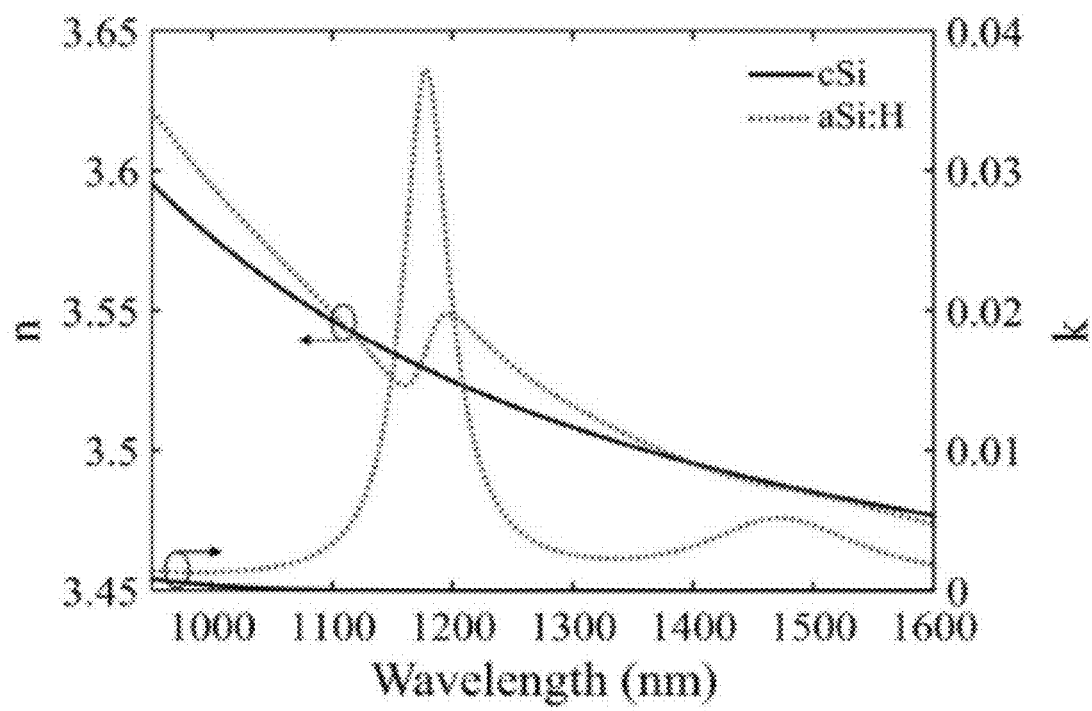
FIG. 19 illustrates refractive index n and extinction coefficient k for cSi thin film and aSi:H thin film measured by spectroscopic ellipsometry.
Figure 20:
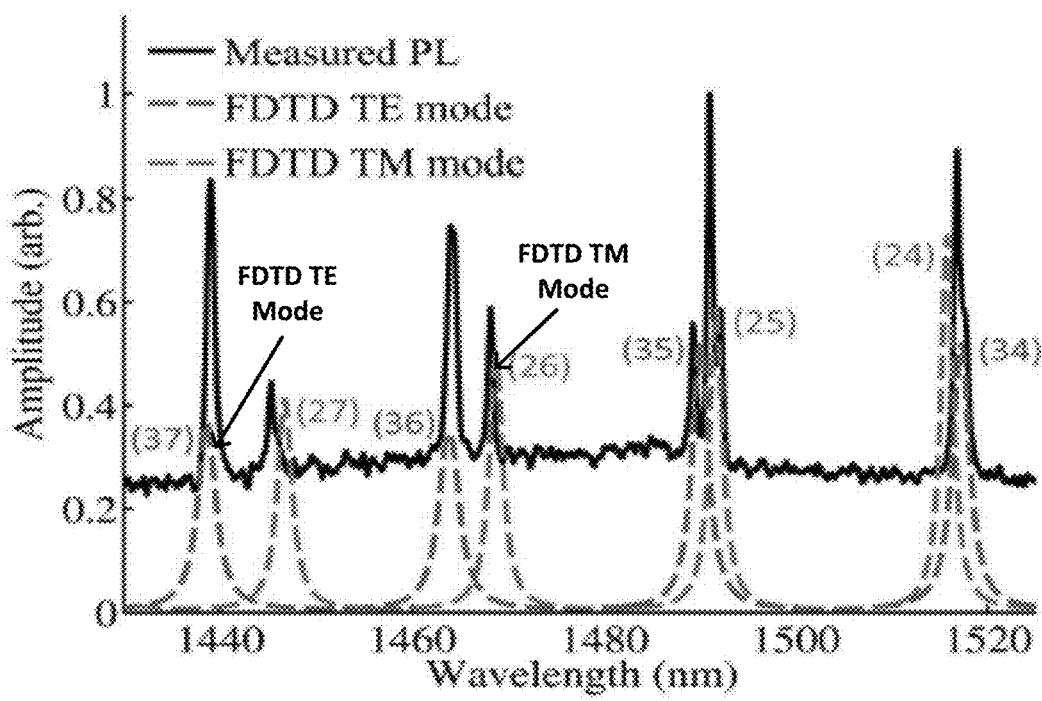
FIG. 20 illustrates an overlay of computed ring resonances with the measured PL spectrum. The numbers in parentheses correspond to the mode order.

To confirm the origin of the peaks in the PL spectrum of FIG. 18B, three-dimensional finite difference time domain (FDTD) computations are performed with the same ring resonator geometry (222 nm waveguide height, 550 nm waveguide width, 3.2 µm radius) as the measured device and the aSi:H complex refractive index taken from the ellipsometry measurements shown in FIG. 19. Simulated ring resonances under TE and TM excitation are shown in FIG. 20 with PL measurement data overlaid. Good agreement is observed between the simulated and measured peaks, indicating that the PL enhancement is due to the formation of resonant modes inside the ring cavity. For each resonance, the mode order m is calculated by $$m = \frac{2\pi n_{eff}}{\lambda} R, \qquad (2)$$

where $n_{eff}$ is the mode effective index, $\lambda$ is the resonance wavelength, and R is the 3.2 µm ring radius.

As a validation of the material k values measured by spectroscopic ellipsometry and reported in FIG. 19, the mode effective and bulk material k values are extracted directly from the PL spectrum. At each resonance, the mode effective k is found numerically from the ring resonator intrinsic Q equation:

$$Q_i = \frac{\lambda}{\Delta\lambda} = \frac{2\pi^2 R N_g}{\lambda} \frac{\sqrt{x}}{1-x}, \qquad (3)$$

$$\text{with } x = e^{-\alpha 2\pi R}, \text{ and } \alpha = \frac{2\pi}{\lambda} k_{eff}, \qquad (4)$$

where $\Delta\lambda$ is the PL resonance full width at half-maximum, $N_g$ is the waveguide group index, $\alpha$ is the loss per length in the ring, and $k_{eff}$ is the imaginary part of the mode effective index. Only $k_{eff}$ is unknown in Eqs. (3) and (4) since $\lambda$ and $\Delta\lambda$ are taken from PL measurements and $N_g$ is taken from FDTD computations. After calculating $k_{eff}$ from Eqs. (3)-(4), the corresponding imaginary part of the bulk film refractive index is determined by simulating the complex mode effective index in a 222 nm tall by 550 nm wide aSi:H waveguide with a real n given by FIG. 19 and variable material loss $k_{mat}$. The extracted material k values are on the order of 1E-3 across the 1300-1600 nm wavelength range in agreement with FIG. 19.

Figure 21:
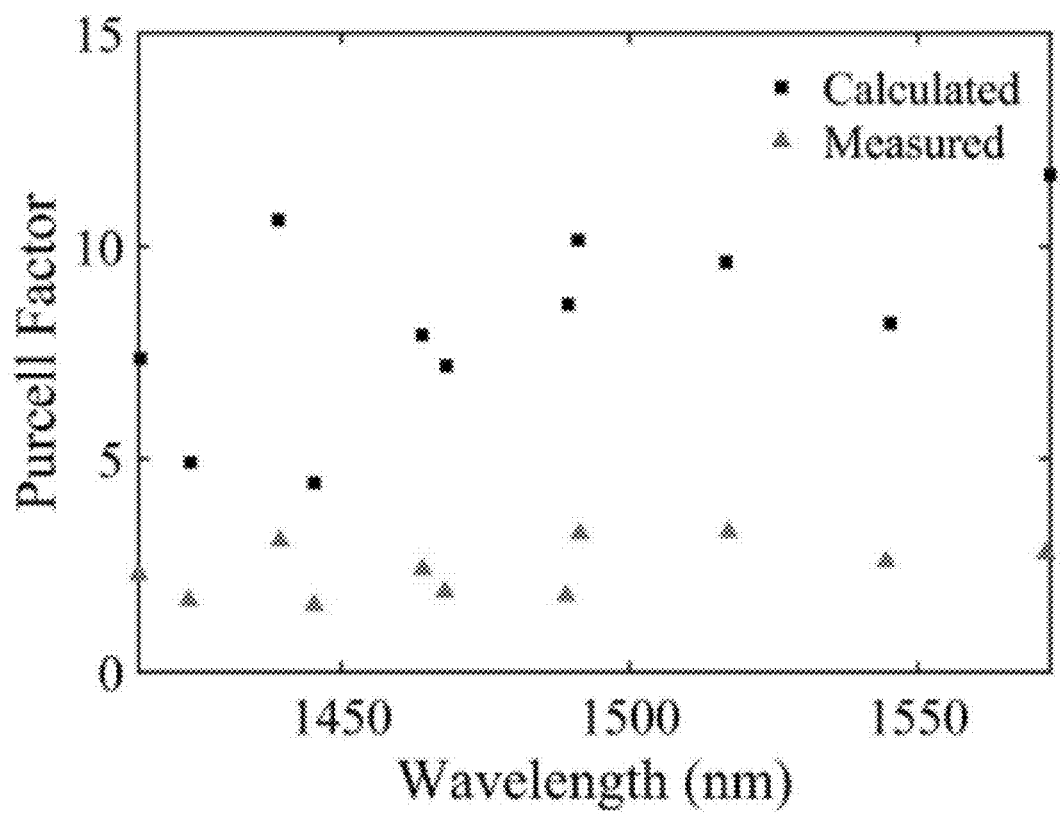
FIG. 21 illustrates calculated and measured Purcell factor $F_p$.

To calculate the Purcell factor enhancement in Eq. (1), the measured quality factors from the PL spectrum are combined with FDTD computations for mode effective index $n_{eff}$ and mode volume V using ellipsometry data in FIG. 19 as input. The simulated mode volumes range from 1.4-1.8 µm² and 1.9-2.6 µm² for the TE and TM modes, respectively. The measured Purcell factor is given by the enhancement in FIG. 18B of the resonant peaks over the broadband PL. The results are shown in FIG. 21. The same order of magnitude is observed for the calculated and measured enhancement. The calculated Purcell factor from Eq. (1) is considered an upper bound; it does not account for emitter-cavity mismatch, or the impact of the measurement setup, which only measures light scattered vertically away from the chip.

While ring resonators were chosen for ease of fabrication for the examples described above, this disclosure contemplates that the techniques described herein can be extended to more complex resonators with much higher WV ratios to give stronger Purcell enhancement. For instance, photonic crystal cavities can accomplish this by shrinking the mode volume V. Alternatively, degenerate band edge resonators have an extremely high quality factor Q, but a larger mode volume. Last, for these techniques to be useful for on-chip applications, the enhanced light can be coupled into a bus waveguide. For example, aSi:H devices can be deposited and patterned above a SOI photonic integrated circuit. The light emitted from the aSi:H resonators can be evanescently coupled to the cSi device layer where material losses are significantly smaller. Luminescence quantum efficiency can then also be estimated based on useful optical power coupled into the transparent cSi waveguide.

Enhanced PL has been demonstrated at the resonant modes of integrated optical aSi:H ring resonators. The luminescence spectrum covers both the 1300 nm and 1550 nm communications bands. Thus, integrated optical light sources can be envisioned in the telecommunications band using on luminescence from aSi:H resonators as described herein.

REFERENCES

S. E. Miller, "Integrated optics: an introduction," Bell System Technical Journal 48, 2059-2069 (1969).

P. K. Tien, "Light Waves in Thin Films and Integrated Optics," Applied Optics 10, 2395-2413 (1971).

L. C. Kimerling, "Silicon microphotonics," Applied Surface Science 159, 8-13 (2000).

T. Koch, M. Liehr, D. Coolbaugh, J. Bowers, R. Alferness, M. Watts, and L. Kimerling, "The American Institute for Manufacturing Integrated Photonics: advancing the ecosystem," International Society for Optics and Photonics SPIE OPTO, 977202-977202 (2016).

B. Jalali, M. Paniccia, and G. Reed, "Silicon Photonics, "IEEE Microwave Magazine 7, 58-68 (2006).

T. Baehr-Jones, L. Pinguet, T., G.-Q., S. Danziger, D. Prather, and M. Hochberg, "Myths and rumours of silicon photonics," Nature Photonics 6, 206-208 (2012).

M. Heck and J. Bowers, "Energy Efficient and Energy Proportional Optical Interconnects for Multi-Core Processors: Driving the Need for On-Chip Sources," IEEE Journal of Selected Topics in Quantum Electronics 20, 332-343 (2014).

J. Sun, E. Timurdogan, A. Yaacobi, E. S. Hosseini, and M. R. Watts, "Large-scale nanophotonic phased array," Nature 493, 195-199 (2013).

H. Yamada, T. Chu, S. Ishida, and Y. Arakawa, "Si photonic wire waveguide devices," IEEE Journal of Selected Topics in Quantum Electronics 12, 1371-1379 (2006).

J. S. Foresi, D. R. Lim, L. Liao, A. M. Agarwal, and L. C. Kimerling, "Small radius bends and large angle splitters in SOI waveguides," Proceedings SPIE 3007, 112-118 (1997).

D. Miller, "Device requirements for optical interconnects to silicon chips," Proceedings IEEE 97, 1166-1185 (2009).

O. Boyraz and B. Jalali, "Demonstration of a silicon Raman laser," Optics Express 12, 5269-5273 (2004).

H. Rong, R. Jones, A. Liu, O. Cohen, D. Hak, A. Fang, and M. Paniccia, "A continuous-wave Raman silicon laser," Nature 433, 725-728 (2005).

W. Bogaerts, R. Baets, P. Dumon, V. Wiaux, S. Beckx, D. Taillaert, B. Luyssaert, J. Van Campenhout, P. Bienstman, and D. Van Thourhout, "Nanophotonic waveguides in silicon-on-insulator fabricated with CMOS technology," Journal of Lightwave Technology 23, 401-412 (2005).

Q. Xu, D. Fattal, and R. G. Beausoleil, "Silicon microring resonators with 1.5-µm radius," Optics Express 16, 4309-4315 (2008).

B. G. Lee, B. A. Small, Q. Xu, M. Lipson, and K. Bergman, "Characterization of a 4×4 Gb/s parallel electronic bus to WDM optical link silicon photonic translator," IEEE Photonics Technology Letters 19, 456-459 (2007).

V. R. Almeida, C. A. Barrios, R. R. Panepucci, and M. Lipson, "All-optical control of light on a silicon chip," Nature 431, 1081-1084 (2004).

P. Sun and R. M. Reano, "Submilliwatt thermo-optic switches using freestanding silicon-on-insulator strip waveguides," Optics Express 18, 8406-8411 (2010).

Z. Huang, N. Kong, X. Guo, M. Liu, N. Duan, A. L. Beck, S. K. Banerjee, and J. C. Campbell, "21-GHz-bandwidth germanium-on-silicon photodiode using thin SiGe buffer layers, IEEE Journal Selected Topics in Quantum Electronics 12, 1450-1454 (2006).

A. Liu, R. Jones, L. Liao, D. Samara-Rubio, D. Rubin, O. Cohen, R. Nicolaescu, and M. Paniccia, "A high-speed silicon optical modulator based on a metal-oxide semiconductor capacitor," Nature 427, 615-618 (2004).

Q. Xu, S. Manipatruni, B. Schmidt, J. Shakya, and M. Lipson, "12.5 Gbit/s carrier-injection-based silicon microring silicon modulators," Optics Express 15, 430-436 (2007).

M. Wood, R. Patton, and R. M. Reano, "Telecommunications Band Photoluminescence from Hydrogenated Amorphous Silicon Ring Resonators," in Conference on Lasers and Electro-Optics (CLEO): May 14, 2017, OSA Technical Digest (online) (Optical Society of America), paper SM2K.7.

M. G. Wood, J. R. Burr, and R. M. Reano, "Degenerate band edge resonances in periodic silicon ridge waveguides," Optics Letters 40, 2493-2496 (2015).

J. R. Burr, N. Gutman, C. M. de Sterke, I. Vitebskiy, and R. M. Reano, "Degenerate band edge resonances in coupled periodic silicon optical waveguides," Optics Express 21, 8736-8745 (2013).

J. R. Burr, M. G. Wood, and R. M. Reano, "Fifth power scaling of quality factor in silicon photonic degenerate band edge resonators," in CLEO: 2014, OSA Technical Digest (online) (Optical Society of America, 2014), paper STu3M.2.

M. G. Wood, J. R. Burr, and R. M. Reano, "Periodic Silicon Ridge Waveguides Exhibiting Degenerate Band Edge Resonances," in Frontiers in Optics, OSA Annual Meeting (Optical Society of America, 2015), paper FTu1D.3.

Q. Xu, L. Chen, M. Wood, P. Sun, and R. M. Reano, "Electrically tunable optical polarization rotation on a silicon chip using Berry's phase," Nature Communications 5, 5337 (2014).

Peng Sun and Ronald M. Reano, "Cantilever couplers for intra-chip coupling to silicon photonic integrated circuits," Optics Express 17, 4565-4574 (2009).

A. Shakoor, R. Lo Savio, S. L. Portalupi, D. Gerace, L. C. Andreani, M. Galli, T. F. Krauss, and L. O'Faolain, "Enhancement of room temperature sub-bandgap light emission from silicon photonic crystal nanocavity by Purcell effect," Physica B 407, 4027-4031 (2012).

A. Shakoor, R. Lo Savio, P. Cardile, S. Portalupi, D. Gerace, K. Welna, S. Boninelli, G. Franzo, F. Priolo, T. F. Krauss, M. Galli, and L. O'Faolain, "Room temperature all-silicon photonic crystal nanocavity light emitting diode at sub-bandgap wavelengths" Laser Photonics Reviews 7, 114-121 (2013).

R. Soref, "Mid-infrared photonics in silicon and germanium," Nature Photonics 4, 495-497 (2010).

H. R. Philipp and E. A. Taft, "Optical constants of silicon in the region 1 to 10 eV," Physical Review 120, 37-38 (1960).

F. Vollmer and S. Arnold, "Whispering-gallery-mode biosensing: label-free detection down to single molecules," Nature Methods 5, 591-596 (2008).

H. Hunt and A. Armani, "Label-free biological and chemical sensors," Nanoscale 2, 1544-1559 (2010).

A. Densmore, M. Vachon, D. Xu, S. Janz, R. Ma, Y. Li, G. Lopinski, A. Delâge, J. Lapointe, C. Luebbert, and Q. Liu, "Silicon photonic wire biosensor array for multiplexed real-time and label-free molecular detection," Optics letters 1, 3598-3600 (2009).

R. W. Boyd and J. E. Heebner, "Sensitive disk-resonator photonic biosensor," Applied Optics 40, 5742-5747 (2001).

M. Iqbal, M. Gleeson, B. Spaugh, F. Tybor, W. Gunn, M. Hochberg, T. Baehr-Jones, R. Bailey, L. Gunn, "Label-free biosensor arrays based on silicon ring resonators and high-speed optical scanning instrumentation," IEEE Journal of Selected Topics in Quantum Electronics 16, 654-661 (2010).

A. Ruege and R. M. Reano, "Multimode waveguides coupled to single mode ring resonators," Journal of Lightwave Technology 27, 2035-2043 (2009).

J. R. Chelikowsky and M. L. Cohen, "Nonlocal pseudo-potential calculations for the electronic structure of eleven diamond and zinc-blende semiconductors," Physical Review B 14, 556-582 (1976).

P. J. Dean, J. R. Haynes, and W. F. Flood, "New radiative recombination processes involving neutral donors and acceptors in silicon and germanium," Physical Review 161, 711-729 (1967).

E. Yablonovitch and T. Gmitter, "Auger recombination in silicon at low carrier densities," Applied Physics Letters 49, 587,589 (1986).

Z. H. Lu, D. J. Lockwood, and J-M. Baribeau, "Quantum confinement and light emission in SiO2/Si superlattices," Nature 378, 258-260 (1995).

M. Zacharias, J. Heitmann, R. Scholz, U. Kahler, M. Schmidt, and J. Bläsing, "Size-controlled highly luminescent silicon nanocrystals: A SiO/SiO2 superlattice approach," Applied Physics Letters 80, 661-663 (2002).

A. E. Siegman, Lasers (University Science Books, 1986).

A. Shakoor, R. Lo Savio, S. L. Portalupi, D. Gerace, L. C. Andreani, M. Galli, T. F. Krauss, and L. O'Faolain, "Enhancement of room temperature sub-bandgap light emission from silicon photonic crystal nanocavity by Purcell effect," Physica B 407, 4027-4031 (2012).

A. Shakoor, R. Lo Savio, S. Portalupi, D. Gerace, L. C. Andreani, M. Galli, T. F.

Krauss, and L. O'Faolain, "Enhancement of room temperature sub-bandgap light emission from silicon photonic crystal nanocavity by Purcell effect" Physica B 407, 4027-4031 (2012).

A. Shakoor, R. Lo Savio, P. Cardile, S. Portalupi, D. Gerace, K. Welna, S. Boninelli, G. Franzo, F. Priolo, T. F. Krauss, M. Galli, and L. O'Faolain, "Room temperature all-silicon photonic crystal nanocavity light emitting diode at sub-bandgap wavelengths" Laser Photonics Reviews 7, 114-121 (2013).

S. J. Jeng, G. S. Oehrlein, and G. J. Scilla, "Hydrogen plasma induced defects in silicon," Applied Physics Letters 53, 1735-1737 (1988).

H. Weman, B. Monemar, G. S. Oehrlein, and S. J. Jeng, "Strain-induced quantum confinement of carriers due to extended defects in silicon," Physical Review B 42, 3109-3113 (1990).

H. Weman, B. Monemar, G. S. Oehrlein, and S. J. Jeng, "Strain-induced quantum confinement of carriers due to extended defects in silicon," Physical Review B 42, 3109-3113 (1990).

S. Iwamoto, and Y. Arakawa, "Observation of enhanced photoluminescence from silicon photonic crystal nanocavity at room temperature," Applied Physics Letters 91, 211104: 1-3 (2007).

E. M. Purcell, "Spontaneous emission probabilities at radio frequencies," Physical Review 69, 681-681 (1946).

H.-G. Park, S.-H. Kim, S.-H. Kwon, Y.-G. Ju, J.-K. Yang, J.-H. Baek, S.-B. Kim, and Y.-H. Lee, "Electrically Driven Single-Cell Photonic Crystal Laser," Science 305, 1444-1447 (2004).

B. Ellis, M. A. Mayer, G. Shambat, T. Sarmiento, J. Harris, E. E. Haller, and J. Vučković, "Ultralow-threshold electrically pumped quantum-dot photonic-crystal nanocavity laser," Nature Photonics 5, 297-300 (2011).

D. A. B. Miller, "Optical interconnects to electronic chips," Applied Optics 49, F59-F70 (2010).

H. Altug and J. Vučković, "Photonic crystal nanocavity array laser," Optics Express 13, 8819-8828 (2005).

A. Shakoor, R. Lo Savio, P. Cardile, S. Portalupi, D. Gerace, K. Welna, S. Boninelli, G. Franzo, F. Priolo, T. F. Krauss, M. Galli, and L. O'Faolain, "Room temperature all-silicon photonic crystal nanocavity light emitting diode at sub-bandgap wavelengths" Laser Photonics Reviews 7, 114-121 (2013).

N. M. Johnson, F. A. Ponce, R. A. Street, and R. J. Nemanich, "Defects in single-crystal silicon induced by hydrogenation," Physical Review B 35, 4166-4169 (1987).

C. Ghica, L. C. Nistor, S. Vizireanu, and G. J. Dinescu, "Annealing of hydrogen-induced defects in RF-plasma-treated Si wafers: ex situ and in situ transmission electron microscopy studies," Journal of Physics D: Applied Physics 44, 295401:1-8 (2011).

H. Nordmark, R. Holmestad, J. C. Walmsley, and A. J. Ulyashin, "Transmission electron microscopy study of hydrogen defect formation at extended defects in hydrogen plasma treated multicrystalline silicon," Journal of Applied Physics 105, 033506:1-7, (2009).

T. Komljenovic, M. Davenport, J. Hulme, A. Liu, C. Santis, A. Spott, S. Srinivasan, E. Stanton, C. Zhang, and J. Bowers, "Heterogeneous Silicon Photonic Integrated Circuits," Journal of Lightwave Technology 34, 20-35 (2016).

A. W. Fang, H. Park, O. Cohen, R. Jones, M. J. Paniccia, and J. E. Bowers, "Electrically pumped hybrid AlGaInAs-silicon evanescent laser," Optics Express 14, 9203-9210 (2006).

C. Zhang, S. Srinivasan, Y. Tang, M. J. R. Heck, M. L. Davenport, and J. E. Bowers, "Low threshold and high speed short cavity distributed feedback hybrid silicon lasers," Optics Express 22, 10202-10209 (2014).

K. Narayanan and S. Preble, "Optical nonlinearities in hydrogenated-amorphous silicon waveguides," Optics Express 18, 8998-9005 (2010).

B. Kuyken, S. Clemmen, S. Selvaraja, W. Bogaerts, D. Van Thourhout, P. Emplit, S. Massar, G. Roelkens, and R. Baets, "On-chip parametric amplification with 26.5 dB gain at telecommunication wavelengths using CMOS-compatible hydrogenated amorphous silicon waveguides," Optics Letters 36, 552-554 (2011).

S. K. Selvaraja, E. Sleeckx, M. Schaekers, W. Bogaerts, D. V. Thourhout, P. Dumon, and R. Baets, "Low-loss amorphous silicon-on-insulator technology for photonic integrated circuitry," Optics Communications 282, 1767-1770 (2009).

E. M. Purcell, "Spontaneous emission probabilities at radio frequencies," Physical Review 69, 681-681 (1946).

M. Wood, R. Patton, and R. M. Reano, "Telecommunications Band Photoluminescence from Hydrogenated Amorphous Silicon Ring Resonators," in Conference on Lasers and Electro-Optics (CLEO): May 14, 2017, OSA Technical Digest (online) (Optical Society of America), paper SM2K.7.

A. Shakoor, R. Lo Savio, P. Cardile, S. Portalupi, D. Gerace, K. Welna, S. Boninelli, G. Franzo, F. Priolo, T. F. Krauss, M. Galli, and L. O'Faolain, "Room temperature all-silicon photonic crystal nanocavity light emitting diode at sub-bandgap wavelengths" Laser Photonics Reviews 7, 114-121 (2013).

E. M. Purcell, "Spontaneous emission probabilities at radio frequencies," Physical Review 69, 681-681 (1946).

A. Shakoor, R. Lo Savio, S. Portalupi, D. Gerace, L. C. Andreani, M. Galli, T. F. Krauss, and L. O'Faolain, "Enhancement of room temperature sub-bandgap light emission from silicon photonic crystal nanocavity by Purcell effect" Physica B 407, 4027-4031 (2012).

A. Figotin and I. Vitebskiy, "Gigantic transmission band-edge resonance in periodic stacks of anisotropic layers," Physical Review E 72, 036619 (2005).

A. Figotin and I. Vitebskiy, "Slow wave phenomena in photonic crystals," Laser & Photonics Reviews 5, 201-213 (2011).

J. Burr, M. Wood, and R. M. Reano, "Fifth Power Scaling of Quality Factor in Silicon Photonic Degenerate Band Edge Resonators," In CLEO: Science and Innovations, pp. STu3M-2. Optical Society of America (2014).

M. G. Wood, J. R. Burr, and R. M. Reano, "7 nm/V DC tunability and millivolt scale switching in silicon carrier injection degenerate band edge resonators," Optics Express 24, 23481-23493 (2016).

J. R. Burr and R. M. Reano, "Zero-coupling-gap degenerate band edge resonators in silicon photonics," Optics Express 23, 30933-30942 (2015).

M. G. Wood, J. R. Burr, and R. M. Reano, "Degenerate band edge resonances in periodic silicon ridge waveguides," Optics Letters 40, 2493-2496 (2015).

J. R. Burr, N. Gutman, C. Martijn de Sterke, I. Vitebskiy, and R. M. Reano, "Degenerate band edge resonances in coupled periodic silicon optical waveguides," Optics Express 21, 8736-8745 (2013).

A. Shakoor, R. Lo Savio, P. Cardile, S. Portalupi, D. Gerace, K. Welna, S. Boninelli, G. Franzo, F. Priolo, T. F. Krauss, M. Galli, and L. O'Faolain, "Room temperature all-silicon photonic crystal nanocavity light emitting diode at sub-bandgap wavelengths" Laser Photonics Reviews 7, 114-121 (2013).

R. Pafchek, R. Tummidi, J. Li, M. A. Webster, E. Chen, and T. L. Koch, "Low-loss silicon-on-insulator shallow-ridge TE and TM waveguides formed using thermal oxidation," Applied Optics 48, 958-963 (2009).

V. R. Manfrinato, L. Zhang, D. Su, H. Duan, R. G. Hobbs, E. A. Stach, and K. K. Berggren, "Resolution limits of electron-beam lithography toward the atomic scale," Nano Letters 13, 1555-1558 (2013).

M. G. Wood, L. Chen, J. R. Burr, and R. M. Reano, "Optimization of electron beam patterned hydrogen silsesquioxane mask edge roughness for low-loss silicon waveguides," Journal of Nanophotonics 8, 083098:1-14 (2014).

M. G. Wood, J. R. Burr, and R. M. Reano, "7 nm/V DC tunability and millivolt scale switching in silicon carrier injection degenerate band edge resonators," Optics Express 24, 23481-23493 (2016).

P. Sun and R. M. Reano, "Submilliwatt thermo-optic switches using freestanding silicon-on-insulator strip waveguides," Optics Express 18, 8406-8411 (2010).

T. Fukazawa, F. Ohno, and T. Baba, "Very Compact Arrayed-Waveguide-Grating Demultiplexer Using Si Photonic Wire Waveguides," Japan Journal of Applied Physics 43, L673-L675 (2004).

J. Brouckaert, W. Bogaert, P. Dumon, D. V. Thourhout, and R. Baets, "Planar concave grating demultiplexer fabricated on a nanophotonic silicon-on-insulator platform," Journal of Lightwave Technology 24, 1269-1275 (2007).

M. Oguma, T. Kitoh, T. Shibata, Y. Inoue, K. Jinguji, A. Himeno, and Y. Hibino, "Four-channel flat top low-loss filter for wide passband WDM access network," Electronics Letters 37, 514-515 (2001).

A. Ruege and R. M. Reano, "Multimode waveguide-cavity sensor based on fringe visibility detection," Optics Express 17, 4295-4305 (2009).

S. E. Miller, "Integrated optics: an introduction," Bell System Technical Journal 48, 2059-2069 (1969).

R. Soref, "The Past, Present, and Future of Silicon Photonics," IEEE Journal of Selected Topics in Quantum Electronics 12, 1678-1687 (2006).

F. Xia, M. Rooks, L. Sekaric, and Y. Vlasov, "Ultra-compact high order ring resonator filters using submicron silicon photonic wires for on-chip optical interconnects," Optics Express 15, 11934-11941 (2007).

V. R. Almeida, C. A. Barrios, R. R. Panepucci, and M. Lipson, "All-optical control of light on a silicon chip," Nature 431, 1081-1084 (2004).

M. Khan, H. Shen, Y. Xuan, L. Zhao, S. Xiao, D. E. Leaird, A. M. Weiner, and M. Qi. "Ultrabroad-bandwidth arbitrary radiofrequency waveform generation with a silicon photonic chip-based spectral shaper," Nature Photonics 4, 117-122 (2010).

K. Vahala, "Optical microcavities," Nature 424, 839-846 (2003).

H. Krzyżanowska, K. S. Ni, Y. Fu, and P. M. Fauchet, "Electroluminescence from Er-doped $SiO_2$/nc-Si multilayers under lateral carrier injection," Mater. Sci. Eng. B 177, 1547-1550 (2012).

P. K. Bhat, A. J. Rhodes, T. M. Searle, I. G. Austin, and J. Allison, "The 0.9 eV defect luminescence band in sputtered and other forms of plasma-deposited a-Si:H," Philos. Mag. Part B 47, L99-L105 (1983).

J. I. Pankove and D. E. Carlson, "Electroluminescence in amorphous silicon," Appl. Phys. Lett. 29, 620-622 (1976).

S. Lin, Y. Kobayashi, Y. Ishikawa, and K. Wada, "Luminescence enhancement by Si ring resonator structures on silicon on insulator," Appl. Phys. Lett. 92, 21113 (2008).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for fabricating a thin film with light-emitting or light detecting capability, comprising:

depositing a thin film of amorphous silicon on a wafer, wherein crystalline defects are distributed throughout the thin film, and wherein the thin film with the crystalline defects is configured to exhibit luminescence enhancement at a wavelength greater than a bandgap wavelength of crystalline silicon.

2. The method of claim 1, wherein the thin film has a thickness greater than about 50 nanometers (nm).

3. The method of claim 1, wherein the crystalline defects are distributed greater than 50 nm from a surface of the thin film.

4. The method of claim 1, wherein the thin film is deposited using a low temperature plasma enhanced chemical vapor deposition (LT-PECVD) process.

5. The method of claim 1, further comprising patterning and etching a resonator structure from the thin film.

6. The method of claim 5, wherein the resonator structure is at least one of a ring resonator or a band-edge resonator.

7. The method of claim 5, wherein the resonator structure is configured to exhibit luminescence enhancement at a wavelength greater than about 1,100 nm.

8. The method of claim 7, wherein the resonator structure is configured to exhibit luminescence enhancement across wavelengths from about 1,260 nm to about 1,660 nm.

9. A photonic device, comprising:
 a p-doped region and an n-doped region formed on a wafer; and
 a resonator structure formed on the wafer, the resonator structure comprising a thin film of amorphous silicon, wherein the resonator structure is arranged between the p-doped and n-doped regions to form a PIN junction, wherein crystalline defects are distributed throughout the thin film, and wherein the film with the crystalline defects is configured to exhibit luminescence enhancement at a wavelength greater than a bandgap wavelength of crystalline silicon.

10. The photonic device of claim 9, wherein the thin film has a thickness greater than about 50 nanometers (nm).

11. The photonic device of claim 9, wherein the crystalline defects are distributed greater than 50 nm from a surface of the thin film.

12. The photonic device of claim 9, wherein the resonator structure is at least one of a ring resonator or a band-edge resonator.

13. The photonic device of claim 9, wherein the resonator structure is configured for Q/V scaling.

14. The photonic device of claim 13, wherein the resonator structure is a one-row, two-row, or multi-row band-edge resonator.

15. The photonic device of claim 9, wherein the resonator structure is configured to emit light when a forward bias is applied across the PIN junction.

16. The photonic device of claim 15, wherein the resonator structure is configured to emit light in-plane with respect to the wafer.

17. The photonic device of claim 15, wherein the resonator structure is configured to exhibit luminescence enhancement at a wavelength greater than about 1,100 nm.

18. The photonic device of claim 17, wherein the resonator structure is configured to exhibit luminescence enhancement across wavelengths from about 1,260 nm to about 1,660 nm.

19. The photonic device of claim 9, wherein the resonator structure is configured to detect light when a reverse bias is applied across the PIN junction.

* * * * *